(12) United States Patent
Leem et al.

(10) Patent No.: US 12,439,707 B2
(45) Date of Patent: Oct. 7, 2025

(54) INFRARED PHOTODIODE AND SENSOR AND ELECTRONIC DEVICE

(71) Applicant: Samsung Electronics Co., Ltd., Suwon-si (KR)

(72) Inventors: Dong-Seok Leem, Seongnam-si (KR); Ohkyu Kwon, Seoul (KR); Rae Sung Kim, Hwaseong-si (KR); Insun Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 747 days.

(21) Appl. No.: 17/716,251

(22) Filed: Apr. 8, 2022

(65) Prior Publication Data

US 2023/0015790 A1    Jan. 19, 2023

(30) Foreign Application Priority Data

Jun. 28, 2021  (KR) .................. 10-2021-0083800

(51) Int. Cl.
*H10F 39/12*     (2025.01)
*H10F 30/222*    (2025.01)
(Continued)

(52) U.S. Cl.
CPC ......... *H10F 39/193* (2025.01); *H10F 30/222* (2025.01); *H10F 39/184* (2025.01);
(Continued)

(58) Field of Classification Search
CPC .... H10F 39/193; H10F 30/222; H10F 39/184; H10F 77/244; H10F 77/413; H10K 30/10;
(Continued)

(56) References Cited

U.S. PATENT DOCUMENTS 8,076,839 B2   12/2011   Kuma et al.
8,426,727 B2    4/2013   Pfeiffer et al.
(Continued)

FOREIGN PATENT DOCUMENTS

CN   104961746 B    9/2017
CN   105838104 B   11/2017
(Continued)

OTHER PUBLICATIONS

Ning Li et al., "SWIR Photodetection and Visualization Realized by Incorporating an Organic SWIR Sensitive Bulk Heterojunction", Advanced Science, DOI: 10.1002/advs.202000444, 8 pages, 2020.
(Continued)

*Primary Examiner* — Yasser A Abdelaziz
(74) *Attorney, Agent, or Firm* — Harness, Dickey & Pierce, P.L.C.

(57) ABSTRACT

An infrared photodiode includes a first electrode including a reflective layer, a second electrode facing the first electrode, and a photoelectric conversion layer between the first electrode and the second electrode. The photoelectric conversion layer includes an infrared absorbing material. A maximum absorption wavelength of the infrared absorbing material in a solution state is greater than about 700 nm and less than or equal to about 950 nm. The infrared photodiode is configured to exhibit an external quantum efficiency (EQE) spectrum in a wavelength region of greater than or equal to about 1000 nm.

31 Claims, 17 Drawing Sheets

(51) Int. Cl.
*H10F 39/18* (2025.01)
*H10F 77/20* (2025.01)
*H10F 77/40* (2025.01)
*H10K 30/10* (2023.01)
*H10K 30/82* (2023.01)
*H10K 30/87* (2023.01)
*H10K 30/30* (2023.01)
*H10K 85/20* (2023.01)
*H10K 85/60* (2023.01)

(52) U.S. Cl.
CPC ......... *H10F 77/244* (2025.01); *H10F 77/413* (2025.01); *H10K 30/10* (2023.02); *H10K 30/82* (2023.02); *H10K 30/87* (2023.02); *H10K 30/30* (2023.02); *H10K 85/211* (2023.02); *H10K 85/655* (2023.02)

(58) Field of Classification Search
CPC ........ H10K 30/82; H10K 30/87; H10K 30/30; H10K 85/211; H10K 85/655; H10K 39/32; H10K 30/451; H10K 30/81; H10K 30/88
See application file for complete search history.

(56) References Cited

U.S. PATENT DOCUMENTS

| | | |
|---|---|---|
| 8,460,581 B2 | 6/2013 | Hartmann et al. |
| 8,471,019 B2 | 6/2013 | Berens et al. |
| 8,481,754 B2 | 7/2013 | Zhou et al. |
| 8,710,094 B2 | 4/2014 | Zhou et al. |
| 8,859,445 B2 | 10/2014 | Cabodi et al. |
| 9,490,432 B2 | 11/2016 | Zeika et al. |
| 10,036,838 B2 | 7/2018 | Bak et al. |
| 10,273,251 B2 | 4/2019 | Sasaki et al. |
| 10,431,747 B2 | 10/2019 | Zeika et al. |
| 10,505,125 B2 | 12/2019 | Jang et al. |
| 10,732,333 B2 | 8/2020 | Norizuki et al. |
| 10,877,195 B2 | 12/2020 | Mori et al. |
| 10,950,800 B2 | 3/2021 | Han et al. |
| 11,075,341 B2 | 7/2021 | Yaacobi-Gross |
| 11,152,581 B2 | 10/2021 | Barr et al. |
| 2012/0146172 A1* | 6/2012 | Carey .................. H10F 77/957 257/E31.13 |
| 2018/0305552 A1 | 10/2018 | Matsumura et al. |
| 2019/0196073 A1 | 6/2019 | Samejima et al. |
| 2020/0225390 A1 | 7/2020 | Takahashi et al. |
| 2020/0227642 A1 | 7/2020 | Yaacobi-Gross |
| 2020/0235168 A1* | 7/2020 | Lee ........................ H10K 39/32 |
| 2020/0373502 A1 | 11/2020 | Wang et al. |
| 2021/0036251 A1 | 2/2021 | Kim et al. |
| 2021/0083199 A1* | 3/2021 | Choi ...................... H10K 85/40 |
| 2021/0126210 A1 | 4/2021 | Barr et al. |
| 2021/0184145 A1 | 6/2021 | Barr et al. |
| 2021/0343891 A1* | 11/2021 | Leem .................... H10F 30/288 |
| 2021/0373502 A1 | 12/2021 | Sudo et al. |

FOREIGN PATENT DOCUMENTS

| | | |
|---|---|---|
| EP | 2578592 B1 | 4/2013 |
| EP | 2005497 B1 | 10/2014 |
| JP | 2011-165426 A | 8/2011 |
| JP | 5214250 B2 | 6/2013 |
| JP | 5480403 B2 | 4/2014 |
| JP | 5480404 B2 | 4/2014 |
| JP | 5600365 B2 | 10/2014 |
| JP | 6227697 B2 | 11/2017 |
| JP | 2019-530976 A | 10/2019 |
| JP | 2020-510030 A | 4/2020 |
| JP | 6751762 B2 | 9/2020 |
| KR | 10-1251455 B1 | 4/2013 |
| KR | 10-1404333 B1 | 6/2014 |
| KR | 2018-0022134 A | 3/2018 |
| KR | 10-1852804 B1 | 4/2018 |
| KR | 2018-0120106 A | 11/2018 |
| KR | 10-1943350 B1 | 1/2019 |
| KR | 2019-0045299 A | 5/2019 |
| KR | 2019-0083773 A | 7/2019 |
| KR | 2020-0015751 A | 2/2020 |
| KR | 2020-0056286 A | 5/2020 |
| KR | 10-2129746 B1 | 7/2020 |
| KR | 10-2180286 B1 | 11/2020 |
| KR | 2021-0015726 A | 2/2021 |

OTHER PUBLICATIONS

Korean Office Action dated Jun. 17, 2025 for corresponding Korean Application No. 10-2021-0083800, and English-language translation thereof.

* cited by examiner

INFRARED PHOTODIODE AND SENSOR AND ELECTRONIC DEVICE

CROSS-REFERENCE TO RELATED APPLICATION

This application claims priority to and the benefit of Korean Patent Application No. 10-2021-0083800 filed in the Korean Intellectual Property Office on Jun. 28, 2021, the entire contents of which are incorporated herein by reference.

BACKGROUND

1. Field

Infrared photodiodes, sensors, and electronic devices are disclosed.

2. Description of the Related Art

In recent years, infrared sensors configured to detect light in infra-red wavelength spectrum have been researched to improve sensitivity of the sensors in a low-illumination environment or for use as a biometric or authentication device. Silicon photodiodes may be used as infrared sensors. However, although silicon is configured to absorb light in a near-infrared wavelength spectrum of less than about 1000 nm from a visible wavelength spectrum, there is a limit in absorbing light in the near-infrared wavelength spectrum of greater than or equal to about 1000 nm.

SUMMARY

Some example embodiments provide an infrared photodiode that may be effectively used to sense light in a near-infrared to short-wavelength infrared spectrum of greater than or equal to about 1000 nm.

Some example embodiments provide a sensor including the infrared photodiode.

Some example embodiments provide an electronic device including the infrared photodiode or the sensor.

According to some example embodiments, an infrared photodiode, may include a first electrode, the first electrode including a reflective layer; a second electrode, the second electrode facing the first electrode; and a photoelectric conversion layer between the first electrode and the second electrode, the photoelectric conversion layer including an infrared absorbing material. A maximum absorption wavelength of the infrared absorbing material in a solution state may be greater than about 700 nm and less than or equal to about 950 nm. The infrared photodiode may be configured to exhibit an external quantum efficiency (EQE) spectrum in a wavelength region of greater than or equal to about 1000 nm.

A peak wavelength of the EQE spectrum of the infrared photodiode may be in a range of about 1000 nm to about 3000 nm. A full width at half maximum of the EQE spectrum of the infrared photodiode may be in a range of about 5 nm to about 200 nm.

The photoelectric conversion layer may include the infrared absorbing material, and a counter material forming a pn junction with the infrared absorbing material. The wavelength region of the EQE spectrum of the infrared photodiode may be overlapped with a portion of a wavelength region of an absorption spectrum of the photoelectric conversion layer. A peak wavelength of the EQE spectrum of the infrared photodiode may be longer than a peak wavelength of the absorption spectrum of the photoelectric conversion layer.

A difference between the peak wavelength of the EQE spectrum of the infrared photodiode and the peak wavelength of the absorption spectrum of the photoelectric conversion layer may be greater than or equal to about 100 nm.

The peak wavelength of the EQE spectrum of the infrared photodiode may be in a range of about 1000 nm to about 3000 nm. The peak wavelength of the absorption spectrum of the photoelectric conversion layer may be in a range of about 700 nm to about 1000 nm.

The photoelectric conversion layer may include the infrared absorbing material, and a counter material forming a pn junction with the infrared absorbing material. A peak wavelength of the EQE spectrum of the infrared photodiode may be at least partially defined by a composition ratio of the infrared absorbing material to the counter material. The peak wavelength of the EQE spectrum of the infrared photodiode may be proportional to the composition ratio of the infrared absorbing material to the counter material, such that, as the composition ratio of the infrared absorbing material to the counter material increases, the peak wavelength of the EQE spectrum of the infrared photodiode shifts to a longer wavelength.

The composition ratio of the infrared absorbing material to the counter material may be about 0.10 to about 1.00.

A peak wavelength of the EQE spectrum of the infrared photodiode may be at least partially defined by a thickness of the photoelectric conversion layer. The peak wavelength of the EQE spectrum of the infrared photodiode may be proportional to the thickness of the photoelectric conversion layer, such that, as the thickness of the photoelectric conversion layer increases, the peak wavelength of the EQE spectrum of the infrared photodiode shifts to a longer wavelength.

The thickness of the photoelectric conversion layer may be about 100 nm to about 500 nm.

The second electrode may include a semi-transmissive layer forming a microcavity with the reflective layer of the first electrode. A peak wavelength of the EQE spectrum of the infrared photodiode may correspond to a resonance wavelength of the microcavity.

The second electrode may include a light-transmitting auxiliary layer between the semi-transmissive layer and the photoelectric conversion layer. The peak wavelength of the EQE spectrum of the infrared photodiode may be at least partially defined by a thickness of the light-transmitting auxiliary layer of the second electrode. The peak wavelength of the EQE spectrum of the infrared photodiode may be proportional to the thickness of the light-transmitting auxiliary layer of the second electrode, such that, as the thickness of the light-transmitting auxiliary layer of the second electrode increases, the peak wavelength of the EQE spectrum of the infrared photodiode shifts to a longer wavelength.

The thickness of the light-transmitting auxiliary layer of the second electrode may be about 5 nm to about 50 nm.

The second electrode may be a light-transmitting electrode. The infrared photodiode may further include an optical auxiliary layer on the second electrode, the optical auxiliary layer forming a microcavity with the reflective layer of the first electrode. A peak wavelength of the EQE spectrum of the infrared photodiode may correspond to a resonance wavelength of the microcavity.

The second electrode may include an inorganic nanolayer facing the photoelectric conversion layer. The inorganic nanolayer may include ytterbium (Yb), calcium (Ca), potassium (K), barium (Ba), magnesium (Mg), lithium fluoride (LiF), or an alloy thereof.

The first electrode may include a light-transmitting auxiliary layer between the reflective layer and the photoelectric conversion layer. A peak wavelength of the EQE spectrum of the infrared photodiode may be at least partially defined by a thickness of the light-transmitting auxiliary layer of the first electrode. The peak wavelength of the EQE spectrum of the infrared photodiode may be proportional to the thickness of the light-transmitting auxiliary layer of the first electrode, such that, as the thickness of the light-transmitting auxiliary layer of the first electrode increases, the peak wavelength of the EQE spectrum of the infrared photodiode shifts to a longer wavelength.

The thickness of the light-transmitting auxiliary layer of the first electrode may be about 5 nm to about 50 nm.

The infrared photodiode may further include a buffer layer that is at least one of between the first electrode and the photoelectric conversion layer, or between the second electrode and the photoelectric conversion layer. A peak wavelength of the EQE spectrum of the infrared photodiode may be at least partially defined by a thickness of the buffer layer. The peak wavelength of the EQE spectrum of the infrared photodiode may be proportional to the thickness of the buffer layer, such that, as the thickness of the buffer layer increases, the peak wavelength of the EQE spectrum of the infrared photodiode shifts to a longer wavelength.

The thickness of the buffer layer may be about 5 nm to about 200 nm.

The infrared photodiode may be configured to exhibit a peak wavelength of an EQE spectrum belonging to about 1000 nm to about 1300 nm. The infrared photodiode may be configured to exhibit a maximum external quantum efficiency at the peak wavelength of the EQE spectrum, where the maximum external quantum efficiency is greater than or equal to about 5%.

The infrared absorbing material may be a compound that is configured to have a temperature of less than or equal to about 500° C. at which a weight loss of 50% compared to an initial weight of the compound occurs during thermogravimetric analysis of the compound at an ambient pressure of less than or equal to about 10 Pa.

The infrared absorbing material may be a coplanar compound including at least one quinoid moiety.

The infrared absorbing material may be a material that is represented by Chemical Formula 1:

[Chemical Formula 1]

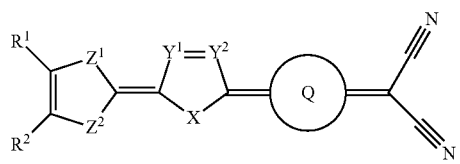

wherein, in Chemical Formula 1, X is O, S, Se, Te, SO, $SO_2$, $NR^a$, $CR^bR^c$, or $SiR^dR^e$; $Y^1$ and $Y^2$ are each independently $CR^f$ or N; $Z^1$ and $Z^2$ are each independently O, S, Se, Te, or $NR^g$; Q is at least one substituted or unsubstituted 5-membered quinoid ring, at least one substituted or unsubstituted 6-membered quinoid ring, or a fused ring thereof; $R^1$ and $R^2$ are each independently hydrogen, a substituted or unsubstituted C1 to C30 alkyl group, a substituted or unsubstituted C1 to C30 alkoxy group, a substituted or unsubstituted C1 to C30 thioalkoxy group, a substituted or unsubstituted C6 to C30 aryl group, a substituted or unsubstituted C3 to C30 heterocyclic group, a substituted or unsubstituted silyl group, a halogen, or any combination thereof; $R^a$ to $R^g$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, a cyano group, or any combination thereof; $R^1$ and $R^2$ are each independently present or combine with each other to form a ring; $R^b$ and $R^c$ are each independently present or combine with each other to form a ring; $R^d$ and $R^e$ are each independently present or combine with each other to form a ring; and adjacent $R^f$'s are each independently present or combine with each other to form a ring.

The infrared absorbing material may be represented by Chemical Formula 1-1:

[Chemical Formula 1-1]

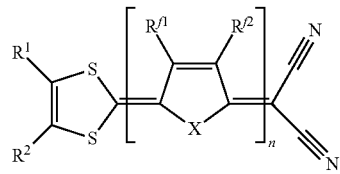

wherein, in Chemical Formula 1-1, X is O, S, Se, Te, SO, $SO_2$, $NR^a$, $CR^bR^c$, or $SiR^dR^e$; $R^1$ and $R^2$ are each independently hydrogen, a substituted or unsubstituted C1 to C30 alkyl group, a substituted or unsubstituted C1 to C30 alkoxy group, a substituted or unsubstituted C1 to C30 thioalkoxy group, a substituted or unsubstituted C6 to C30 aryl group, a substituted or unsubstituted C3 to C30 heterocyclic group, a substituted or unsubstituted silyl group, a halogen, or any combination thereof; $R^a$ to $R^e$, $R^{f1}$ and $R^{f2}$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, a cyano group, or any combination thereof; and n is an integer of 2 to 4.

According to some example embodiments, a sensor may include a semiconductor substrate; and the infrared photodiode on the semiconductor substrate.

According to some example embodiments, an electronic device may include the infrared photodiode.

According to some example embodiments an infrared photodiode may include a first electrode, the first electrode including a reflective layer; a second electrode, the second electrode facing the first electrode; and a photoelectric conversion layer between the first electrode and the second electrode, the photoelectric conversion layer configured to photoelectrically convert at least a portion of incident light. At least a portion of the infrared photodiode forms a microcavity with the reflective layer of the first electrode, the photoelectric conversion layer being between the first electrode and the portion of the infrared photodiode. The infrared photodiode may be configured to exhibit an external quantum efficiency (EQE) spectrum having a wavelength region that includes a peak wavelength of the EQE spectrum of the infrared photodiode that corresponds to a resonance wavelength of the microcavity. The wavelength region of the EQE spectrum of the infrared photodiode may be different from a wavelength region of an absorption spectrum of the photoelectric conversion layer.

The peak wavelength of the EQE spectrum of the infrared photodiode may be longer than a peak wavelength of the absorption spectrum of the photoelectric conversion layer.

The second electrode may include a semi-transmissive layer forming the microcavity with the reflective layer of the first electrode.

The second electrode may be a light-transmitting electrode. The infrared photodiode may further include an optical auxiliary layer on the second electrode, the optical auxiliary layer forming the microcavity with the reflective layer of the first electrode.

According to some example embodiments, a sensor may include a semiconductor substrate; and the infrared photodiode on the semiconductor substrate.

According to some example embodiments, an electronic device may include the infrared photodiode.

Light in the near-infrared to short-wavelength infrared spectrum of greater than or equal to about 1000 nm may be effectively and photoelectrically converted.

DETAILED DESCRIPTION

Figure 1:
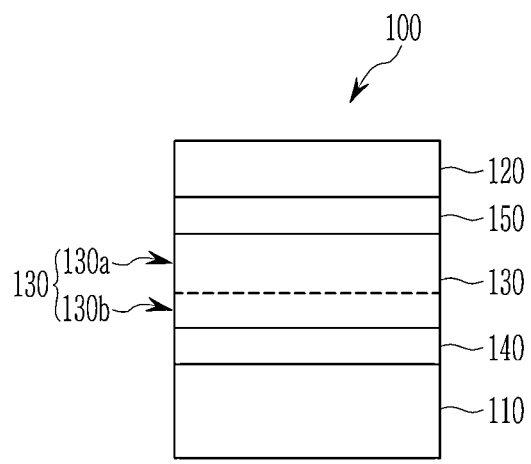
FIG. 1 is a cross-sectional view showing an example of an infrared photodiode according to some example embodiments.

Hereinafter, example embodiments will be described in detail so that those of ordinary skill in the art can easily implement them. The inventive concepts may, however, be embodied in many different forms and are not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

In the drawings, parts having no relationship with the description are omitted for clarity of some example embodiments, and the same or similar constituent elements are indicated by the same reference numeral throughout the specification.

Hereinafter, the terms "lower" and "upper" are used for better understanding and ease of description, but do not limit the location relationship.

As used herein, when a definition is not otherwise provided, "substituted" refers to replacement of hydrogen of a compound by a substituent selected from a halogen, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and any combination thereof.

As used herein, when a definition is not otherwise provided, "hetero" refers to one including 1 to 4 heteroatoms selected from N, O, S, Se, Te, Si, and P.

Hereinafter, the "maximum absorption wavelength" may be a wavelength exhibiting the highest absorption (absorbance) in the entire wavelength region. Hereinafter, "peak wavelength" may be a wavelength corresponding to a peak of each wavelength spectrum in one or more wavelength spectra. When there are two or more wavelength spectra in the entire wavelength region, the "peak wavelength" may be two or more.

Hereinafter, an infrared photodiode according to some example embodiments is described.

The infrared photodiode according to some example embodiments may be configured to absorb at least a portion of light in an infrared wavelength region (e.g., infrared wavelength spectrum) and convert it (e.g., the absorbed portion of light) photoelectrically, wherein the infrared wavelength region may include a portion or all of the near-infrared, short-wavelength infrared, mid-wavelength infrared, and far-infrared wavelength regions, for example greater than about 700 nm and less than or equal to about 1 mm, within the above range, greater than about 700 nm and less than or equal to about 3000 nm, greater than about 700 nm and less than or equal to about 2500 nm, greater than about 700 nm and less than or equal to about 2000 nm, greater than about 700 nm and less than or equal to about 1800 nm, greater than about 700 nm and less than or equal to about 1500 nm, about 750 nm to about 1 mm, about 750 nm to about 3000 nm, about 750 nm to about 2500 nm, about 750 nm to about 2000 nm, about 750 nm to about 1800 nm, about 750 nm to about 1500 nm, about 800 nm to about 1 mm, about 800 nm to about 3000 nm, about 800 nm to about 2500 nm, about 800 nm to about 2000 nm, about 800 nm to about 1800 nm, or about 800 nm to about 1500 nm, but the present inventive concepts are not limited thereto.

Figure 2:
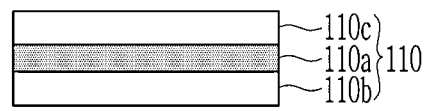
FIG. 2 is a cross-sectional view showing an example of a first electrode of the infrared photodiode of FIG. 1.
Figure 3:
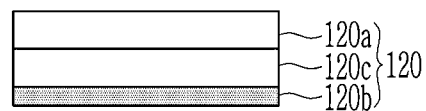
FIG. 3 is a cross-sectional view showing an example of a second electrode of the infrared photodiode of FIG. 1.

FIG. 1 is a cross-sectional view showing an example of an infrared photodiode according to some example embodiments, FIG. 2 is a cross-sectional view showing an example of a first electrode of the infrared photodiode of FIG. 1, and FIG. 3 is a cross-sectional view showing an example of a second electrode of the infrared photodiode of FIG. 1.

Referring to FIG. 1, an infrared photodiode 100 according to some example embodiments includes a first electrode 110, a second electrode 120 facing the first electrode 110, a photoelectric conversion layer 130 between the first electrode 110 and the second electrode 120, and buffer layers 140 and 150. It will be understood that, in some example embodiments, one or both of the buffer layers 140 and/or 150 may be omitted from the infrared photodiode.

One of the first electrode 110 or the second electrode 120 is an anode and the other is a cathode. For example, the first electrode 110 may be an anode and the second electrode 120 may be a cathode. For example, the first electrode 110 may be a cathode and the second electrode 120 may be an anode. The second electrode 120 may be an incident electrode disposed in a direction in which light is incident.

The first electrode 110 may be a reflective electrode including a reflective layer. The reflective layer may form (e.g., define) a microcavity (e.g., an optical microcavity, also referred to as a microresonator) together with at least one portion (e.g., at least one other layer) of the infrared photodiode 100 such that the photoelectric conversion layer 130 is between the first electrode 110 and the portion of the infrared photodiode 100, said portion including for example a semi-transmissive layer to be described later to control (e.g., at least partially define) a wavelength (e.g., a detection wavelength) and efficiency indicating electrical characteristics of the infrared photodiode 100. This will be described later.

For example, referring to FIG. 2, the first electrode 110 may include a reflective layer 110a, a lower auxiliary layer 110b, and an upper auxiliary layer 110c.

The reflective layer 110a may have high reflectance and low light transmittance, and may have, for example, a reflectance of about 10% to about 100%, about 20% to about 100%, about 30% to about 100%, about 50% to about 100%, about 70% to about 100%, about 80% to about 100%, about 90% to about 100%, about 95% to about 100%, about 98% to about 100%, or about 99% to about 100%, for example a light transmittance of greater than or equal to about 0% to less than about 10%, about 0% to about 8%, about 0% to about 7%, about 0% to about 5%, about 0% to about 3%, or about 0% to about 1%. The reflective layer 110a may include an optically opaque material, for example, a metal, a metal nitride, or any combination thereof, for example, silver (Ag), copper (Cu), aluminum (Al), gold (Au), titanium (Ti), chromium (Cr), nickel (Ni), alloys thereof, nitrides thereof (e.g., TiN), or any combination thereof, but is not limited thereto. The reflective layer 110a may have one or two or more layers.

At least one of the lower auxiliary layer 110b or the upper auxiliary layer 110c may be a light-transmitting auxiliary layer, and the light-transmitting auxiliary layer may have, for example, a relatively high light transmittance of about 80% to about 100%, about 85% to about 100%, about 88% to about 100%, or about 90% to about 100%. The light-transmitting auxiliary layer may include an optically transparent conductor, for example, may include at least one of an oxide conductor, a carbon conductor, and a metal thin film. The oxide conductors may include, for example, one or more selected from indium tin oxide (ITO), indium zinc oxide (IZO), zinc tin oxide (ZTO), aluminum tin oxide (ATO), and aluminum zinc oxide (AZO), the carbon conductor may include one or more selected from graphene and carbon nanomaterials, and the metal thin film may include, for example, a metal thin film formed to a thin thickness of several nanometers to several tens of nanometers, or a single layer or a plurality of metal thin films formed to a thin thickness of several nanometers to several tens of nanometers doped with metal oxide.

For example, the lower auxiliary layer 110b may be an adhesion auxiliary layer that improves adhesion to a substrate (not shown) or a lower layer (not shown). A thickness of the lower auxiliary layer 110b may be, for example less than or equal to about 30 nm, less than or equal to about 25 nm, or less than or equal to about 20 nm, within the above range, about 2 nm to about 30 nm, about 2 nm to about 25 nm, or about 2 nm to about 20 nm, but is not limited thereto.

For example, the upper auxiliary layer 110c may face the buffer layer 140 and/or the photoelectric conversion layer 130, and may control a work function of the first electrode 110. For example, the upper auxiliary layer 110c may be the aforementioned light-transmitting auxiliary layer. For example, the upper auxiliary layer 110c may be disposed between the reflective layer 110a and the photoelectric conversion layer 130 to adjust the optical length of the microcavity to be described later. This will be described later. A thickness of the upper auxiliary layer 110c may be, for example, about less than or equal to about 80 nm, less than or equal to about 70 nm, less than or equal to about 60 nm, or less than or equal to about 50 nm, and within the above range, about 5 nm to about 80 nm, about 5 nm to about 70 nm, about 5 nm to about 60 nm, or about 5 nm to about 50 nm, but is not limited thereto.

Herein, as an example, it is illustrated that the lower auxiliary layer 110b is disposed under the reflective layer 110a and the upper auxiliary layer 110c is disposed on the reflective layer 110a. However, the stacking position thereof may be variously changed. Also, at least one of the lower auxiliary layer 110b or the upper auxiliary layer 110c may be omitted.

The second electrode 120 may include a semi-transmissive layer. The semi-transmissive layer may form a microcavity together with the aforementioned reflective layer to control a wavelength (e.g., detection wavelength) and efficiency indicating electrical characteristics in the infrared photodiode 100. This will be described later.

For example, referring to FIG. 3, the second electrode 120 may include a semi-transmissive layer 120a, a lower auxiliary layer 120b, and an upper auxiliary layer 120c.

The semi-transmissive layer 120a may have a light transmittance between the light-transmitting layer and the reflective layer, and for example, may have a light transmittance of about 10% to about 70%, about 20% to about 60%, or about 30% to about 50%. The semi-transmissive layer 120a may be configured to selectively transmit light in a particular (or, alternatively, predetermined) wavelength region and reflect or absorb light in other wavelength regions. The semi-transmissive layer 120a may include, for example, a metal layer or an alloy layer having a relatively thin thickness of about 5 nm to about 40 nm, and may include, for example, silver (Ag), copper (Cu), aluminum (Al), magnesium (Mg), magnesium-silver (Mg—Ag), magnesium-aluminum (Mg—Al), or any combination thereof, but is not limited thereto. A thickness of the semi-transmissive layer 120a may be, for example, less than or equal to about 80 nm, less than or equal to about 70 nm, less than or equal to about 60 nm, less than or equal to about 50 nm, or less than or equal to about 40 nm, within the above range, about 5 nm to about 80 nm, about 5 nm to about 70 nm, about 5 nm to about 60 nm, about 5 nm to about 50 nm, about 5 nm to about 40 nm, about 10 nm to about 80 nm, about 10 nm to about 70 nm, about 10 nm to about 60 about nm, about 10 nm to about 50 nm, about 10 nm to about 40 nm, about 20 nm to about 80 nm, about 20 nm to about 70 nm, about 20 nm to about 60 nm, about 20 nm to about 50 nm or about 20 nm to about 40 nm, but is not limited thereto.

At least one of the lower auxiliary layer 120b or the upper auxiliary layer 120c may be a light-transmitting auxiliary layer, and the light-transmitting auxiliary layer may be the same as described above. For example, the upper auxiliary layer 120c may be a light-transmitting auxiliary layer. A thickness of the upper auxiliary layer 120c may be, for example, less than or equal to about 80 nm, less than or equal to about 70 nm, less than or equal to about 60 nm, or less than or equal to about 50 nm, within the above range, about 5 nm to about 80 nm, about 5 nm to about 70 nm, about 5 nm to about 60 nm, or about 5 nm to about 50 nm, but is not limited thereto. For example, the lower auxiliary layer 120b may be an inorganic nanolayer. The inorganic nanolayer may face the buffer layer 150 and/or the photoelectric conversion layer 130 and may be a very thin inorganic thin film having a thickness of several nanometers. A thickness of the inorganic nanolayer may be, for example, about 1 nm to about 5 nm, about 1 nm to about 4 nm, about 1 nm to about 3 nm, or about 1 nm to about 2 nm. The inorganic nanolayer may include an inorganic material having a work function shallower than that of the semi-transmissive layer 120a, for example, a lanthanide element such as ytterbium (Yb); calcium (Ca); potassium (K); barium (Ba); magnesium (Mg); lithium fluoride (LiF); or an alloy thereof. The inorganic nanolayer may lower an effective work function of the surface of the second electrode 120, thereby facilitating extraction of charges (e.g., electrons) moving from the photoelectric conversion layer 130 to the second electrode 120 to reduce residual charge carriers and exhibit high charge extraction efficiency.

The photoelectric conversion layer 130 may be configured to absorb light of at least a portion of the infrared wavelength region and convert it (e.g., the absorbed light) into an electrical signal. The photoelectric conversion layer 130 includes an infrared absorbing material capable of photoelectric conversion by (e.g., based on) selectively absorbing at least a portion of light in an infrared wavelength region. The infrared absorbing material may be, for example, an organic material, an inorganic material, an organic-inorganic material, or any combination thereof. For example, the infrared absorbing material may be an organic material, for example, may be a non-polymer or a polymer.

For example, the infrared absorbing material may be a near-infrared absorbing material. The near-infrared absorbing material may have, for example, a maximum absorption wavelength ($\lambda_{max, A}$) of less than about 1000 nm in an absorption spectrum measured in a solution state (e.g., the maximum absorption wavelength ($\lambda_{max, A}$) that is measured when the near-infrared absorbing material is in a solution state, which may be a state of being a liquid solution) although example embodiments are not limited thereto (e.g., the maximum absorption wavelength ($\lambda_{max, A}$) may be greater than about 1000 nm in some example embodiments), and may have, for example, a maximum absorption wavelength ($\lambda_{max, A}$) in a wavelength range of greater than about 700 nm and less than about 1000 nm, greater than about 700 nm and less than or equal to about 950 nm, about 750 nm to about 950 nm, or about 750 nm to about 900 nm. Herein, a solution for measuring the absorption spectrum (e.g., the infrared absorbing material in the solution state) may be prepared by (e.g., based on) dissolving the (near-) infrared absorbing material in a solvent that does not affect the absorption characteristics while dissolving the infrared absorbing material. The solvent may be, for example, dimethyl sulfoxide (DMSO), toluene, chloroform, or any combination thereof, and the concentration thereof may be, for example, about $1 \times 10^{-5}$ M to about $5 \times 10^{-5}$ M, but are not limited thereto. For example, a solution state of the infrared absorbing material as described herein (and/or when the infrared absorbing material is described as being in a solution state) may refer to a solution of the infrared absorbing material (as solute) and a solvent that may be, for example, dimethyl sulfoxide (DMSO), toluene, chloroform, or any combination thereof, where the concentration of the infrared absorbing material in the solution may be about $1 \times 10^{-5}$ M to about $5 \times 10^{-5}$ M.

As an example, the infrared absorbing material may be a depositable low-molecular compound that can be evaporated or sublimed according to a temperature increase in a particular (or, alternatively, predetermined) temperature range. Herein, the deposition may be thermal deposition or vacuum deposition. The depositable low-molecular compounds may be identified by thermogravimetric analysis (TGA) of the compounds, and may be an organic compound that lose weight with increasing temperature and lose about 50% or more of their initial weight without substantial decomposition or polymerization.

For example, the infrared absorbing material may be selected from compounds having a weight loss of 10%, 30%, and 50% relative to the initial weight within a particular (or, alternatively, predetermined) range when subjected to thermogravimetric analysis under a relatively high pressure (e.g., a relatively high ambient pressure) of less than or equal to about 10 Pa (e.g., in a high vacuum state). The ambient pressure may be between 0 Pa and about 10 Pa, between about 0.01 Pa and about 10 Pa, between about 0.1 Pa and about 10 Pa, between about 1 Pa and about 10 Pa, or the like. For example, in thermogravimetric analysis of the infrared absorbing material, the temperature $T_{s(10)}$ at which the weight loss of 10% relative to the initial weight occurs may be less than or equal to about 400° C., and the temperature $T_{s(30)}$ at which the weight loss of 30% relative to the initial weight occurs may be less than or equal to about 450° C., and the temperature $T_{s(50)}$ at which a weight loss of 50% relative to the initial weight occurs may be less than or equal to about 500° C. For example, $T_{s(10)}$ of the infrared absorbing material may be for example less than or equal to about 350° C., less than or equal to about 330° C., less than or equal to about 300° C., less than or equal to about 280° C., about 100° C. to about 400° C., about 100° C. to about 350° C., about 100° C. to about 330° C., about 100° C. to about 300° C. or about 100° C. to about 280° C., $T_{s(30)}$ of the infrared absorbing material may be for example less than or equal to about 400° C., less than or equal to about 350° C., less than or equal to about 300° C., about 150° C. to 450° C. about 150° C. to about 400° C., about 150° C. to about 350° C. or about 150° C. to about 300° C., and $T_{s(50)}$ of the infrared absorbing material may be for example less than or equal to about 450° C., less than or equal to about 400° C., less than or equal to about 350° C., less than or equal to about 300° C., about 150° C. to about 500° C., about 150° C. to about 450° C., about 150° C. to about 400° C., about 150° C. to about 350° C. or about 150° C. to about 300° C.

As an example, evaporation or sublimation of the infrared absorbing material may occur stably at a relatively fast rate as the temperature rises. For example, a difference between $T_{s(30)}$ and $T_{s(10)}$ of the infrared absorbing material may be less than or equal to about 50° C., a difference between $T_{s(50)}$ and $T_{s(30)}$ of the infrared absorbing material may be less than or equal to about 50° C., and a difference between $T_{s(50)}$ and $T_{s(10)}$ of the infrared absorbing material may be less than or equal to about 100° C. For example, the difference between $T_{s(30)}$ and $T_{s(10)}$ of the infrared absorbing material may be about 5° C. to about 50° C. and the difference between $T_{s(50)}$ and $T_{s(30)}$ of the infrared absorbing material may be about 5° C. to about 50° C. and the difference between $T_{s(50)}$ and $T_{s(10)}$ of the absorbent material may be about 10° C. to about 100° C.

Such thermal properties may be determined according to (e.g., may be at least partially defined by) the molecular structure of the infrared absorbing material. For example, the infrared absorbing material may be a coplanar compound with high planarity, for example, a coplanar compound having at least one quinoid moiety.

For example, the infrared absorbing material may be a compound that contains a moiety capable of providing electron donating properties and a moiety capable of providing electron accepting properties together with a moiety having high planarity, thereby forming a very large dipole moment. The infrared absorbing material may be, for example, a compound having at least one quinoid moiety, a moiety capable of providing an electron donating property bound to one terminal end of the quinoid moiety, and a moiety capable of providing an electron accepting property bound to the other terminal end of the quinoid moiety.

As an example, the infrared absorbing material may be a compound represented by Chemical Formula 1, but is not limited thereto.

[Chemical Formula 1]

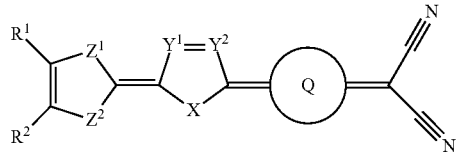

[Group 1]

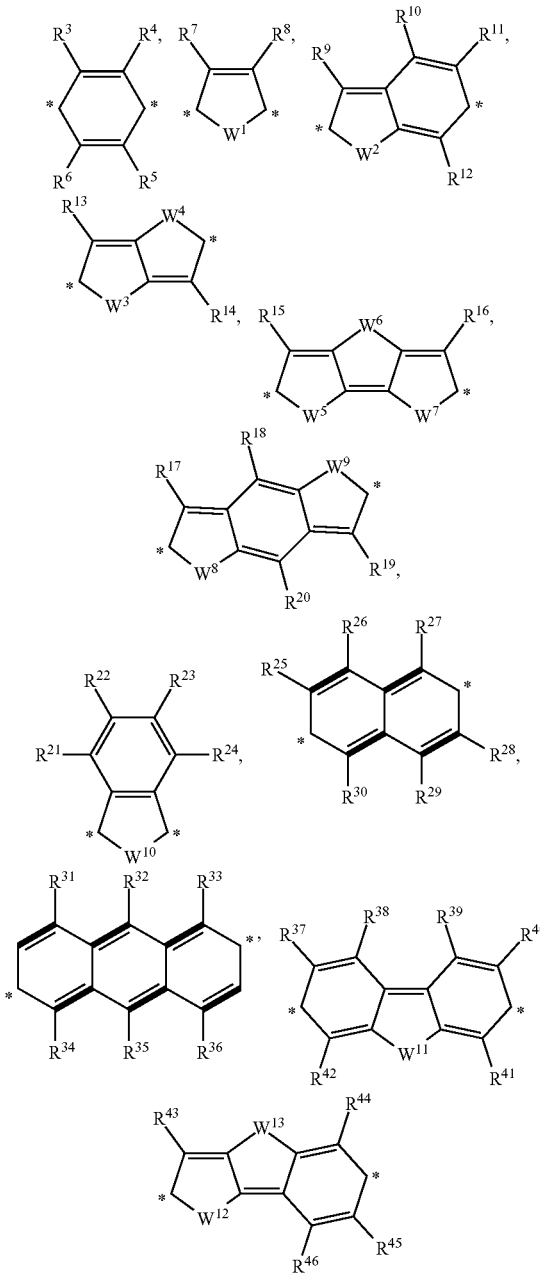

In Chemical Formula 1,

X is O, S, Se, Te, SO, $SO_2$, $NR^a$, $CR^bR^c$, or $SiR^dR^e$, $Y^1$ and $Y^2$ are each independently $CR^f$ or N, $Z^1$ and $Z^2$ are each independently O, S, Se, Te, or $NR^g$, Q is at least one substituted or unsubstituted 5-membered quinoid ring, at least one substituted or unsubstituted 6-membered quinoid ring, or a fused ring thereof, $R^1$ and $R^2$ are each independently hydrogen, a substituted or unsubstituted C1 to C30 alkyl group, a substituted or unsubstituted C1 to C30 alkoxy group, a substituted or unsubstituted C1 to C30 thioalkoxy group, a substituted or unsubstituted C6 to C30 aryl group, a substituted or unsubstituted C3 to C30 heterocyclic group, a substituted or unsubstituted silyl group, a halogen, or any combination thereof, $R^a$ to $R^g$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, a cyano group, or any combination thereof, $R^1$ and $R^2$ are each independently present or combine with each other to form a ring, $R^b$ and $R^c$ are each independently present or combine with each other to form a ring, $R^d$ and $R^e$ are each independently present or combine with each other to form a ring, and adjacent $R^f$'s are each independently present or combine with each other to form a ring.

For example, X may be O, S, Se, Te, or $NR^a$, for example O, S, Se or Te, for example S, Se, or Te, for example S or Se, for example S.

For example, $Y^1$ and $Y^2$ may each be $CR^f$, for example, each may be CH.

For example, one of $Z^1$ and $Z^2$ may be S and the other of $Z^1$ and $Z^2$ may be S, Se, or Te. For example, one of $Z^1$ and $Z^2$ may be S and the other of $Z^1$ and $Z^2$ may be S or Se. For example, $Z^1$ and $Z^2$ may each be S.

For example, X, $Z^1$, and $Z^2$ may each independently be S or Se, for example, each may be S.

For example, Q may include at least one substituted or unsubstituted 5-membered quinoid ring, at least one substituted or unsubstituted 6-membered quinoid ring, or a fused ring thereof. For example, Q may be one or two substituted or unsubstituted 5-membered quinoid rings; a fused ring of one or two substituted or unsubstituted 5-membered quinoid rings; one or two substituted or unsubstituted 6-membered quinoid rings; a fused ring of one or two substituted or unsubstituted 6-membered quinoid rings; a fused ring of one or two substituted or unsubstituted 5-membered quinoid rings and one or two substituted or unsubstituted 6-membered quinoid rings; or any combination thereof.

For example, Q may be one selected from the groups of Group 1, but is not limited thereto.

In Group 1, $W^1$ to $W^{13}$ may each independently be S, Se, or Te, $R^3$ to $R^{46}$ may each independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, a cyano group, or any combination thereof, $R^3$ to $R^{46}$ may each independently be present or adjacent two of $R^3$ to $R^{46}$ may be bonded to each other to form a ring, and may be a linking point with Chemical Formula 1.

For example, the infrared absorbing material may be a compound represented by Chemical Formula 1-1, but is not limited thereto.

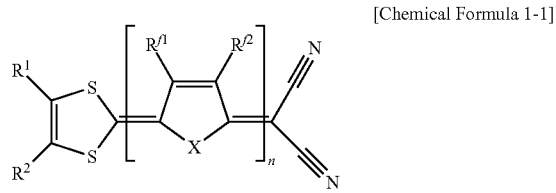

[Chemical Formula 1-1]

In Chemical Formula 1-1,

X, $R^1$, and $R^2$ are the same as described above (e.g., the same as X, $R^1$, and $R^2$ of Chemical Formula 1), $R^{f1}$ and $R^{f2}$ may each independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, a cyano group, or any combination thereof, and n may be an integer of 2 to 4 (e.g., n may be an integer that is between 2 and 4, inclusively, and thus may be an integer that is one of 2, 3, or 4).

In some example embodiments, the infrared absorbing material according to any of the example embodiments may be provided independently of the photoelectric conversion layer 130 and/or any other elements of the infrared photodiode 100. For example, the infrared absorbing material according to some example embodiments may be provided as a liquid material, as a liquid solution (e.g., in a solution state), as a solid material, or the like, which may be used as a process input to at least partially form (e.g., manufacture) a photoelectric conversion layer 130 that is included in an infrared photodiode 100.

The photoelectric conversion layer 130 may further include a counter material capable of forming (e.g., defining) a pn junction with the aforementioned infrared absorbing material. For example, when the aforementioned infrared absorbing material is a p-type semiconductor, the photoelectric conversion layer 130 may further include an n-type semiconductor as a counter material. For example, when the aforementioned infrared absorbing material is an n-type semiconductor, the photoelectric conversion layer 130 may further include a p-type semiconductor as a counter material. The counter material may be, for example, an organic material, an inorganic material, an organic-inorganic material, or any combination thereof. The counter material may be an absorbing material or a non-absorbing material. The counter material may include, but is not limited to, for example, fullerenes or fullerene derivatives. For example, the counter material may be a C60 material.

The photoelectric conversion layer 130 may include a mixed layer in which the infrared absorbing material and the counter material are mixed in the form of a bulk heterojunction. The mixed layer may include an infrared absorbing material and a counter material in a particular (or, alternatively, predetermined) composition ratio, wherein the composition ratio may be defined as a volume or thickness of the near-infrared absorbing material with respect to a volume or thickness of the counter material. For example, the infrared absorbing material may be included in an amount of less than or equal to the counter material. For example, the composition ratio of the infrared absorbing material to the counter material may be about 0.10 to about 1.00, and within the above range, about 0.20 to about 1.00, about 0.30 to about 1.00, about 0.40 to about 1.00, about 0.50 to about 1.00, about 0.10 to about 0.80, about 0.20 to about 0.80, about 0.30 to about 0.80, about 0.40 to about 0.80, 0.50 to about 0.80, about 0.10 to about 0.50, about 0.20 to about 0.50, about 0.30 to about 0.50, or about 0.40 to about 0.50.

The photoelectric conversion layer 130 may include a layer 130a including an infrared absorbing material and a separate layer 130b including a counter material, respectively. The layer 130a including the infrared absorbing material and the layer 130b including the counter material may be formed in a particular (or, alternatively, predetermined) thickness ratio, and for example, the thickness ratio of the layer 130a including the infrared absorbing material to the layer 130b including the counter material may be about 0.1:1 to about 1:1, within the above range, about 0.2:1 to about 1:1, about 0.3:1 to about 1:1, about 0.4:1 to about 1:1, about 0.5:1 to about 1:1, about 0.1:1 to about 0.8:1, about 0.2:1 to about 0.8:1, about 0.3:1 to about 0.8:1, about 0.4:1 to about 0.8:1, about 0.5:1 to about 0.8:1, about 0.1:1 to about 0.5:1, about 0.3:1 to about 0.5:1, or about 0.4:1 to about 0.5:1. It will be understood that "thickness" as used herein with regard to a layer may refer to a thickness in a direction that is perpendicular to one or both of the upper and/or lower surfaces of the layer.

The light absorption characteristics of the photoelectric conversion layer 130 may be exhibited by a combination of the absorption characteristic of the infrared absorption material and the absorption characteristic of the counter material. Accordingly, an absorption spectrum of the photoelectric conversion layer 130 may include an absorption wavelength region of the infrared absorbing material, but may appear in a wider wavelength region than the absorption spectrum of the infrared absorbing material alone. A peak wavelength ($\lambda_{peak,A}$) of the absorption spectrum of the photoelectric conversion layer 130 may be greater than about 700 nm and less than about 1000 nm, and within the above range, greater than about 700 nm and less than about 950 nm, greater than about 700 nm and less than or equal to about 900 nm, about 750 nm to about 900 nm, or about 750 nm to about 850 nm. A full width at half maximum of the absorption spectrum of the photoelectric conversion layer 130 may be, for example, greater than or equal to about 100 nm, and within the above range, about 100 nm to about 800 nm, about 150 nm to about 800 nm, about 200 nm to about 800 nm, about 250 nm to about 800 nm, or about 300 nm to about 800 nm. Herein, a full width at half maximum of the absorption spectrum may be a width of the wavelength corresponding to half of the absorption peak.

The peak wavelength of the external quantum efficiency (EQE) spectrum of the infrared photodiode 100 to be described later may be controlled according to (e.g., at least partially defined by) the thickness of the photoelectric conversion layer 130. For example, approximately according to the peak wavelength of the desired external quantum efficiency (EQE) spectrum, it may be controlled from 50 nm to about 1000 nm and within the above range, from about 80 nm to about 1000 nm, about 100 nm to about 1000 nm, about 120 nm to about 1000 nm, 150 nm to about 1000 nm, about 50 nm to about 800 nm, about 80 nm to about 800 nm, about 100 nm to about 800 nm, about 120 nm to about 800 nm, about 150 nm to about 800 nm, about 50 nm to about 500 nm, about 100 nm to about 500 nm, about 100 nm to about 500 nm, about 120 nm to about 500 nm, about 150 nm to about 500 nm. This will be described later. In some example embodiments, the EQE spectrum may be in a wavelength region of greater than or equal to about 1000 nm (e.g., about 1000 nm to about 3000 nm).

The buffer layers 140 and 150 includes a first buffer layer 140 between the first electrode 110 and the photoelectric conversion layer 130 and a second buffer layer 150 between the second electrode 120 and the photoelectric conversion layer 130. The first buffer layer 140 and the second buffer layer 150 may each independently be a charge auxiliary layer for controlling the mobility of holes and/or electrons separated from the photoelectric conversion layer 130, or a light absorption auxiliary layer for improving light absorption characteristics. For example, the first buffer layer 140 and the second buffer layer 150 may include at least one selected from a hole injecting layer (HIL), a hole transporting layer (HTL), an electron blocking layer (EBL), and an electron injection layer, an electron injecting layer (EIL), an electron transporting layer (ETL), a hole blocking layer (HBL), and/or a light absorption auxiliary layer. The first buffer layer 140 and the second buffer layer 150 may each independently include an organic material, an inorganic material, an organic-inorganic material, or any combination thereof.

The buffer layers 140 and 150 may each independently have a thickness of about 2 nm to about 200 nm, within the above range, about 5 nm to about 200 nm, about 5 nm to about 90 nm, or about 5 nm to about 180 nm.

The buffer layers 140 and 150 may adjust the optical length of the microcavity to be described later. At least one of the first buffer layer 140 or the second buffer layer 150 may be omitted.

The infrared photodiode 100 may further include an anti-reflection layer (not shown) and/or an encapsulant (not shown) on the second electrode 120.

As described above, the infrared photodiode 100 may form a microcavity structure by the first electrode 110 including the reflective layer and the second electrode 120 including the semi-transmissive layer. Light incident to the infrared photodiode 100 may be repeatedly reflected between the reflective layer and the semi-transmissive layer spaced apart by a particular (or, alternatively, predetermined) optical length by a microcavity structure to enhance light in a particular (or, alternatively, predetermined) wavelength region. As an example, light in a particular (or, alternatively, predetermined) wavelength region among the light incident to the infrared photodiode 100 may be modified by being repeatedly reflected between the reflective layer and the semi-transmissive layer. Among the modified lights, light having a wavelength corresponding to (e.g., equaling within a ±10% margin) the resonance wavelength of the fine resonance may be enhanced to exhibit high photoelectric conversion characteristics in a narrow wavelength region.

Due to the microcavity structure, a wavelength region exhibiting photoelectric conversion characteristics in the infrared photodiode 100 may be different from a wavelength region of an absorption spectrum of the photoelectric conversion layer 130. For example, the photoelectric conversion layer 130 (e.g., the infrared photodiode 100) may effectively photoelectrically convert light in a desired wavelength spectrum, for example, near-infrared to short-wavelength infrared of greater than or equal to about 1000 nm according to the design of the microcavity structure of the infrared photodiode 100, while including a near-infrared absorbing material having an absorption spectrum in a near-infrared wavelength region of less than about 1000 nm. Accordingly, the limitation of the absorption characteristics of the near-infrared absorbing material may be overcome and the infrared photodiode 100 may be realized and effectively utilized according to the desired target wavelength for photoelectric conversion in the infrared wavelength region. It will be understood that, in some example embodiments, the photoelectric conversion layer 130 (e.g., the infrared photodiode 100) may effectively photoelectrically convert light in a desired wavelength spectrum that maybe at least partially equal to or less than about 1000 nm. In some example embodiments, the photoelectric conversion layer 130 may include an absorbing material having an absorption spectrum in a wavelength region that may be at least partially equal to or greater than about 1000 nm.

The photoelectric conversion characteristic of the infrared photodiode 100 may be expressed as photoelectric conversion efficiency, and the photoelectric conversion efficiency may be generally evaluated from external quantum efficiency (EQE). EQE may be a ratio of extracted charges to incident photons. That is, if the EQE is high in the particular (or, alternatively, predetermined) wavelength region, it may mean that the photoelectric conversion characteristic is high in the particular (or, alternatively, predetermined) wavelength region and the current can be effectively generated.

EQE according to the wavelength of the infrared photodiode 100 may be expressed as an EQE spectrum. For example, the wavelength region of the EQE spectrum of the infrared photodiode 100 may be overlapped with a portion of the wavelength region of the absorption spectrum of the photoelectric conversion layer 130, but as described above, due to the microcavity structure of infrared photodiode 100, a wavelength region of an EQE spectrum of the infrared photodiode 100 may be different from a wavelength region of an absorption spectrum of the photoelectric conversion layer 130.

For example, the wavelength region of the EQE spectrum of the infrared photodiode 100 may be overlapped with a long wavelength region (e.g., a tail portion of the absorption spectrum) among the wavelength region of the absorption spectrum of the photoelectric conversion layer 130. The wavelength region of the EQE spectrum of the infrared photodiode 100 may be located at a longer wavelength than the wavelength region of the absorption spectrum of the photoelectric conversion layer 130.

The photoelectric conversion wavelength (e.g., detection wavelength) and detection selectivity of the infrared photodiode 100 may be evaluated from the peak wavelength ($\lambda_{peak,EQE}$) and a full width half maximum (FWHM) of the EQE spectrum. Herein, the full width at half maximum (FWHM) of the EQE spectrum may be a wavelength width corresponding to half the maximum value (peak) of the EQE in the corresponding external quantum efficiency (EQE) spectrum.

For example, the peak wavelength ($\lambda_{peak,EQE}$) of the EQE spectrum of the infrared photodiode 100 may be longer than the peak wavelength (maximum absorption wavelength) ($\lambda_{peak,A}$) of the absorption spectrum of the photoelectric conversion layer 130. For example, a difference between the peak wavelength ($\lambda_{peak,EQE}$) of the EQE spectrum of the infrared photodiode 100 and the peak wavelength ($\lambda_{peak,A}$) of the absorption spectrum of the photoelectric conversion layer 130 may be greater than or equal to about 100 nm. That is, the peak wavelength ($\lambda_{peak,EQE}$) of the EQE spectrum of the infrared photodiode 100 is about 100 nm or more longer than the peak wavelength ($\lambda_{peak,A}$) of the absorption spectrum of the photoelectric conversion layer 130. Within the above range, the peak wavelength ($\lambda_{peak,EQE}$) of the EQE spectrum of the infrared photodiode 100 may be about 150 nm or more, about 200 nm or more, about 250 nm or more, about 300 nm or more, about 100 nm to about 700 nm, about 150 nm to about 700 nm, about 200 nm to about 700 nm, about 250 nm to about 700 nm, about 300 nm to about 700 nm, about 100 nm to about 500 nm, about 150 nm to about 500 nm, about 200 nm to about 500 nm, about 250 nm to about 500 nm, or about 300 nm to about 500 nm longer than the peak wavelength ($\lambda_{peak,A}$) of the absorption spectrum of the photoelectric conversion layer 130.

For example, the EQE spectrum of the infrared photodiode 100 may have a peak wavelength ($\lambda_{peak,EQE}$) in the near-infrared to short-wavelength infrared region of greater than or equal to about 1000 nm (although example embodiments are not limited thereto), and may have a relatively narrow full width at half maximum (FWHM). For example, the peak wavelength ($\lambda_{peak,EQE}$) of the EQE spectrum of the infrared photodiode 100 may belong to (e.g., may be within) about 1000 nm to about 3000 nm, and within the range, about 1000 nm to about 2500 nm, about 1000 nm to about 2000 nm, about 1010 nm to about 3000 nm, about 1010 nm to about 2500 nm, about 1010 nm to about 2000 nm, about 1050 nm to about 3000 nm, about 1050 nm to about 2500 nm, or about 1050 nm to about 2000 nm. The full width at half maximum of the EQE spectrum of the infrared photodiode 100 may be narrower than the full width at half maximum of the absorption spectrum of the aforementioned photoelectric conversion layer 130. The full width at half maximum of the EQE spectrum of the infrared photodiode 100 may be, for example, about 5 nm to about 200 nm, and about 5 nm to about 150 nm, about 5 nm to about 120 nm, or about 5 nm to about 100 nm within the above range. Due to the peak wavelength ($\lambda_{peak,EQE}$) and full width at half maximum of the EQE spectrum, the infrared photodiode 100 having improved efficiency and high detection selectivity in the near-infrared to short-wavelength infrared region may be implemented.

As an example, the maximum external quantum efficiency (EQE$_{max}$) at the peak wavelength ($\lambda_{peak,EQE}$) of the EQE spectrum of the infrared photodiode 100 may be greater than or equal to about 5%, within the above range, greater than or equal to about 7%, greater than or equal to about 10%, greater than or equal to about 12%, greater than or equal to about 15%, greater than or equal to about 18%, greater than or equal to about 20%, greater than or equal to about 22%, or greater than or equal to about 25%, within the above range, about 5% to about 80%, about 7% to about 80%, about 10% to about 80%, about 12% to about 80%, about 15% to about 80%, about 18% to about 80%, about 20% to about 80%, about 22% to about 80%, about 25% to about 80%, about 5% to about 70%, about 7% to about 70%, about 10% to about 70%, about 12% to about 70%, about 15% to about 70%, about 18% to about 70%, about 20% to about 70%, about 22% to about 70%, about 25% to about 70%, about 5% to about 50%, about 7% to about 50%, about 10% to about 50%, about 12% to about 50%, about 15% to about 50%, about 18% to about 50%, about 20% to about 50%, about 22% to about 50% or about 25% to about 50%.

The peak wavelength ($\lambda_{peak,EQE}$) of the EQE spectrum of the infrared photodiode 100 may correspond to (e.g., equal within a ±10% margin) the resonance wavelength of the microcavity of the infrared photodiode 100, and accordingly, depending on the design of the microcavity structure of the infrared photodiode 100, the desired target wavelength for photoelectric conversion may be controlled.

For example, in the microcavity structure of the infrared photodiode 100, the resonance wavelength of the microcavity may be determined by (e.g., at least partially defined based on) adjusting a distance between the reflective layer and the semi-transmissive layer, that is, the optical length, and accordingly, the photoelectric conversion to occur at a desired target wavelength may be controlled.

For example, the peak wavelength ($\lambda_{peak,EQE}$) of the EQE spectrum of the infrared photodiode 100 may be controlled by (e.g., at least partially defined by) the thickness of the photoelectric conversion layer 130. As the thickness of the photoelectric conversion layer 130 increases, the optical length becomes longer, so that the resonance wavelength of the microcavity may shift toward a long wavelength region, and accordingly, the EQE spectrum of the infrared photodiode 100 may shift toward the long wavelength region. Accordingly, it will be understood that the peak wavelength of the EQE spectrum of the infrared photodiode 100 may be proportional to the thickness of the photoelectric conversion layer 130. The thickness of the photoelectric conversion layer 130 may be selected within the aforementioned range.

For example, the peak wavelength ($\lambda_{peak,EQE}$) of the EQE spectrum of the infrared photodiode 100 may be controlled by (e.g., at least partially defined by) the thickness of the upper auxiliary layer 110c (e.g., light-transmitting auxiliary layer) of the first electrode 110. As the thickness of the upper auxiliary layer 110c of the first electrode 110 increases, the optical length increases, so that the resonance wavelength of the microcavity may shift toward a longer wavelength region, and thus the EQE spectrum of the infrared photodiode 100 may shift toward the longer wavelength region. Accordingly, it will be understood that the peak wavelength of the EQE spectrum of the infrared photodiode 100 may be proportional to the thickness of the upper auxiliary layer 110c of the first electrode 110. The thickness of the upper auxiliary layer 110c of the first electrode 110 may be selected within the aforementioned range.

For example, the peak wavelength ($\lambda_{peak,EQE}$) of the EQE spectrum of the infrared photodiode 100 may be controlled by (e.g., at least partially defined by) the thickness of the lower auxiliary layer 120b and/or the upper auxiliary layer 120c (e.g., light-transmitting auxiliary layer) of the second electrode 120. As the thickness of the lower auxiliary layer 120b and/or the upper auxiliary layer 120c of the second electrode 120 becomes thicker, the optical path length becomes longer, so that the resonance wavelength of the microcavity may shift toward a longer wavelength region, and accordingly, the EQE spectrum of the infrared photodiode 100 may shift toward a longer wavelength region. Accordingly, it will be understood that the peak wavelength of the EQE spectrum of the infrared photodiode 100 may be proportional to the thickness of the lower auxiliary layer 120b and/or the upper auxiliary layer 120c (e.g., light-transmitting auxiliary layer) of the second electrode 120. The thickness of the lower auxiliary layer 120b and/or the upper auxiliary layer 120c of the second electrode 120 may be selected within the aforementioned range.

For example, a peak wavelength ($\lambda_{peak,EQE}$) of an EQE spectrum of the infrared photodiode 100 may be controlled by (e.g., at least partially defined by) thicknesses of the buffer layers 140 and 150. As the buffer layers 140 and 150 become thicker, an optical length becomes longer, and a resonance wavelength of microcavity may shift more toward a longer wavelength region, and accordingly, the EQE spectrum of the infrared photodiode 100 may shift more toward the longer wavelength region. Accordingly, it will be understood that the EQE spectrum of the infrared photodiode 100 may be proportional to the thickness of at least one of the buffer layers 140 or the buffer layer 150 and/or to a combined thickness of the buffer layers 140 and 150. The buffer layers 140 and 150 may have thicknesses from the above range.

For example, the peak wavelength ($\lambda_{peak,EQE}$) of the EQE spectrum of the infrared photodiode 100 may be controlled by (e.g., at least partially defined by) a composition ratio (volume ratio or thickness ratio) of an infrared absorbing material and a counter material included in the photoelectric conversion layer 130. For example, as the composition ratio (volume ratio or thickness ratio) of the infrared absorbing material relative to the counter material is higher, the resonance wavelength of the microcavity may shift more toward the longer wavelength region, and accordingly, the EQE spectrum of the infrared photodiode 100 may shift toward the longer wavelength region. Accordingly, it will be understood that the EQE spectrum of the infrared photodiode 100 may be proportional to the composition ratio of the infrared absorbing material to the counter material. The composition ratio of the infrared absorbing material relative to the counter material may be selected from the above range.

The infrared photodiode 100 according to some example embodiments may be designed (e.g., configured) to have a microcavity structure that may select a target wavelength for photoelectric conversion out of the infrared wavelength region and control the target wavelength and thus exhibit electrical characteristics at the target wavelength. Particularly, the infrared photodiode 100 may be more widely used by effectively photoelectrically converting light in a long wavelength region, which may not be detected by a silicon photodiode, for example, in a wavelength region of greater than or equal to about 1000 nm, for example, greater than or equal to about 1050 nm, greater than or equal to about 1100 nm, greater than or equal to about 1150 nm, or greater than or equal to about 1200 nm, for example, between about 1000 nm and about 3000 nm, between about 1050 nm and about 3000 nm, between about 1100 nm and about 3000 nm, between about 1150 nm and about 3000 nm, or between 1200 nm and about 3000 nm.

Figure 4:
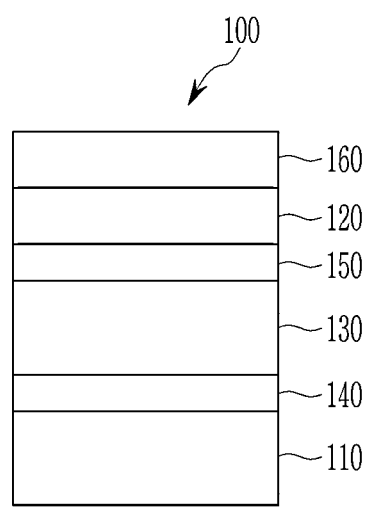
FIG. 4 is a cross-sectional view showing an example of an infrared photodiode according to some example embodiments.
Figure 5:
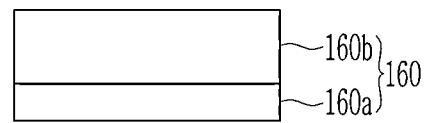
FIG. 5 is a cross-sectional view showing an example of an optical auxiliary layer in the infrared photodiode of FIG. 4.

FIG. 4 is a cross-sectional view showing an example of an infrared photodiode according to some example embodiments, and FIG. 5 is a cross-sectional view showing an example of an optical auxiliary layer in the infrared photodiode of FIG. 4.

Referring to FIG. 4, the infrared photodiode 100 according to some example embodiments includes a first electrode 110, a second electrode 120, a photoelectric conversion layer 130 between the first electrode 110 and the second electrode 120, and buffer layers 140 and 150, like some example embodiments, including the example embodiments shown in FIG. 1.

However, the infrared photodiode 100 according to some example embodiments further includes an optical auxiliary layer 160 unlike some example embodiments, including the example embodiments shown in FIG. 1. The optical auxiliary layer 160 may be configured to selectively transmit light of a particular (or, alternatively, predetermined) wavelength region among the light incident on the infrared photodiode 100 and may be configured to reflect and/or absorb light of other wavelength regions. That is, the optical auxiliary layer 160 may be a selective transmissive layer, for example, a semi-transmissive layer.

Referring to FIG. 5, the optical auxiliary layer 160 includes a first optical auxiliary layer 160a and a second optical auxiliary layer 160b having different refractive indices. Any one of the first optical auxiliary layer 160a or the second optical auxiliary layer 160b may be a high refractive index layer, and may have a refractive index of greater than or equal to about 1.55, for example, about 1.55 to about 1.90 in the infrared wavelength region. The other of the first optical auxiliary layer 160a or the second optical auxiliary layer 160b may be a low refractive index layer, and may have a refractive index of less than about 1.55 in the infrared wavelength region, for example, greater than or equal to about 1.20 or more and less than 1.55. For example, the first optical auxiliary layer 160a may include aluminum oxide, an organic buffer material, an inorganic buffer material, or any combination thereof, and the second optical auxiliary layer 160b may include silicon oxide, silicon nitride, silicon oxynitride, or any combination thereof, but they are not limited thereto.

The thickness of the second optical auxiliary layer 160b may be the same as or thicker than the thickness of the first optical auxiliary layer 160a, for example, the thickness of the second optical auxiliary layer 160b may be about 1.0 times to about 5.0 times, and within the above range, about 1.2 times to about 5 times, about 2 times to about 5 times, or about 3 times to about 5 times the thickness of the first optical auxiliary layer 160a.

The optical auxiliary layer 160 may further include an additional layer (not shown) in addition to the first optical auxiliary layer 160a and the second optical auxiliary layer 160b.

The optical auxiliary layer 160 is a semi-transmissive layer, and unlike some example embodiments, the second electrode 120 may not include a separate semi-transmissive layer. That is, the second electrode 120 may be selected from a light-transmitting layer, a semi-transmissive layer, or any combination thereof. The light-transmitting layer may have a high transmittance of greater than or equal to about 80%, greater than or equal to about 85%, greater than or equal to about 88%, or greater than or equal to about 90%, and may include an optically transparent conductor. The light-transmitting layer may include, for example, at least one of an oxide conductor such as indium tin oxide (ITO), indium zinc oxide (IZO), zinc tin oxide (ZTO), aluminum tin oxide (ATO), and/or aluminum zinc oxide (AZO); a carbon conductor such as graphene and a carbon nanostructure; and/or a metal thin film formed of a thin thickness of several nanometers to tens of nanometers, or a single layer or multiple layers of metal thin film formed of a thin thickness of several nanometers to several tens of nanometers, the metal thin film being doped with metal oxide. For example, each of the second electrode 120 and the optical auxiliary layer 160 may be a semi-transmissive layer. For example, the second electrode 120 may be a light-transmitting layer and the optical auxiliary layer 160 may be a semi-transmissive layer.

The infrared photodiode 100 according to some example embodiments includes the first electrode 110 which may include the reflective layer, the second electrode 120 which may include the semi-transmissive layer, and/or the optical auxiliary layer 160, and the photoelectric conversion layer 130 and the buffer layers 140 and 150 disposed therebetween and thus may form the microcavity structure (e.g., where the optical auxiliary layer 160 is at least a portion of the infrared photodiode 100 that forms a microcavity with a reflective layer of the first electrode 110, the photoelectric conversion layer 130 being between the first electrode 110 and the portion of the infrared photodiode 100), as described above, light corresponding to the resonance wavelength of the microcavity may be enhanced to exhibit photoelectric conversion characteristics at a desired target wavelength. Details are the same as described above.

The infrared photodiode 100 may be applied to various fields using light in an infrared wavelength region as an electrical signal, and may be applied to, for example, a sensor. The sensor including the infrared photodiode 100 may be, for example, an image sensor for improving sensitivity in a low-light environment, a sensor for increasing detection capability of 3D images by broadening the dynamic range for detailed black and white contrast, a security sensor, a vehicle sensor, a biometric sensor, or the like. The biometric sensor may be, for example, an iris sensor, a distance sensor, a fingerprint sensor, or a blood vessel distribution sensor, but is not limited thereto. The sensor including the infrared photodiode 100 may be, for example, a CMOS infrared sensor or a CMOS image sensor.

Figure 6:
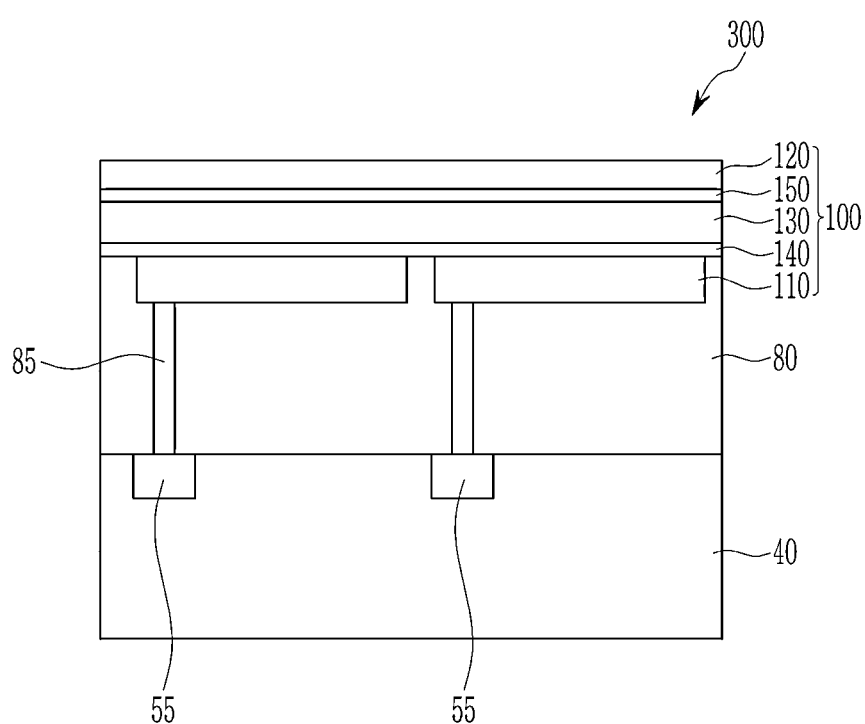
FIG. 6 is a cross-sectional view showing an example of a sensor according to some example embodiments.

FIG. 6 is a cross-sectional view showing an example of a sensor according to some example embodiments.

The sensor 300 according to some example embodiments includes a semiconductor substrate 40, an insulation layer 80, and an infrared photodiode 100.

The semiconductor substrate 40 may be a silicon substrate and is integrated with a transmission transistor (not shown) and a charge storage 55. The charge storage 55 may be integrated in each pixel. The charge storage 55 is electrically connected to the infrared photodiode 100 and information of the charge storage 55 may be transmitted by the transmission transistor. The semiconductor substrate 40 may not include a separate integrated photodiode such as a silicon photodiode.

A metal wire (not shown) and a pad (not shown) are formed on the semiconductor substrate 40. In order to decrease signal delay, the metal wire and pad may be made of a metal having low resistivity, for example, aluminum (Al), copper (Cu), silver (Ag), and alloys thereof, but is not limited thereto. However, it is not limited to the structure and the metal wire and pads may be disposed under the semiconductor substrate 40.

The insulation layer 80 is formed on the metal wire and the pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 55. The trench 85 may be filled with fillers.

The aforementioned infrared photodiode 100 is formed on the insulation layer 80. As described above, the infrared photodiode 100 may include a first electrode 110, a second electrode 120, a photoelectric conversion layer 130 and buffer layers 140 and 150. The infrared photodiode 100 may optionally further include the aforementioned optical auxiliary layer 160, an anti-reflection layer (not shown) and/or an encapsulant (not shown). The description of the infrared photodiode 100 is the same as described above. The infrared photodiodes 100 may be arranged along rows and/or columns on the semiconductor substrate 40, for example, in a matrix form.

A focusing lens (not shown) may be further formed on the infrared photodiode 100. The focusing lens may control a direction of incident light and gather the light in one region. The focusing lens may have a shape of, for example, a cylinder or a hemisphere, but is not limited thereto.

Figure 7:
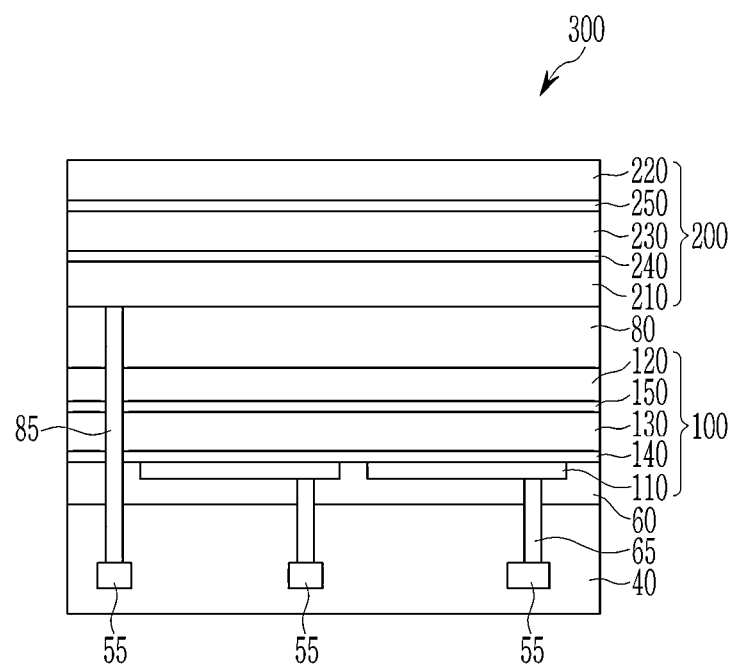
FIG. 7 is a cross-sectional view showing an example of a sensor according to some example embodiments.

FIG. 7 is a cross-sectional view showing an example of a sensor according to some example embodiments.

The sensor according to some example embodiments may include a plurality of sensors having different functions, and the plurality of sensors having different functions may be stacked along the thickness direction of the semiconductor substrate 40.

As an example, the plurality of sensors having different functions may be an infrared sensor and/or an image sensor. For example, a sensor for improving the sensitivity of the image sensor in a low-light environment, a sensor to increase the detection ability of a three-dimensional image by expanding the dynamic range that distinguishes between black and white details, a security sensor, a vehicle sensor, a biometric sensor, and an image sensor may be independently selected and combined. The image sensor may be configured to absorb and detect light in a red wavelength region, a green wavelength region, a blue wavelength region, or any combination thereof.

For example, the plurality of sensors may include two infrared photodiodes. For example, a plurality of infrared photodiodes may include a first infrared photodiode absorbing light of a first infrared wavelength spectrum belonging to an infrared wavelength region and photoelectrically converting it and a second infrared photodiode absorbing light of a second infrared wavelength spectrum belonging to the infrared wavelength region and photoelectrically converting it.

A peak wavelength of the first infrared wavelength spectrum and a peak wavelength of the second infrared wavelength spectrum may be different from each other, for example, within a wavelength region of greater than about 700 nm and less than or equal to 3000 nm, for example, a peak wavelength difference of the first infrared wavelength spectrum and the second infrared wavelength spectrum may be greater than or equal to about 30 nm and within the above range, greater than or equal to about 50 nm, greater than or equal to about 70 nm, greater than or equal to about 80 nm, or greater than or equal to about 90 nm.

For example, either one of the peak wavelength of the first infrared wavelength spectrum or the peak wavelength of the second infrared wavelength spectrum may belong to (e.g., be within, inclusively) greater than or equal to about 750 nm and less than 1000 nm, and the other one of the peak wavelength of the first infrared wavelength spectrum or the peak wavelength of the second infrared wavelength spectrum may belong to about 1000 nm to about 3000 nm.

For example, a plurality of sensors may include one infrared sensor and one image sensor. For example, the plurality of sensors may have a stacked structure of the above infrared sensor and an image sensor detecting light of a red wavelength region, a green wavelength region, a blue wavelength region, or any combination thereof.

Referring to FIG. 7, the sensor 300 according to some example embodiments includes the upper photodiode 200, the insulation layer 80, the infrared photodiode 100, and the semiconductor substrate 40. The upper photodiode 200 and the infrared photodiode 100 are stacked.

The upper photodiode 200 may be another infrared photodiode (infrared sensor) differing from the infrared photodiode 100 or a visible photodiode (an image sensor) detecting light in a visible wavelength region.

The upper photodiode 200 may be a photoelectric conversion device and include a lower electrode 210, an upper electrode 220, a photoelectric conversion layer 230, and buffer layers 240 and 250. Either one of the lower electrode 210 or the upper electrode 220 may be an anode, while the other one may be a cathode. The photoelectric conversion layer 230 may be configured to absorb at least a portion of light of the infrared wavelength region or the visible wavelength region and photoelectrically convert it. The light in the visible wavelength region may be light of a red wavelength region, a green wavelength region, a blue wavelength region, or any combination thereof. The infrared wavelength region absorbing n the photoelectric conversion layer 230 of the upper photodiode 200 may not be overlapped with the infrared wavelength region detected in the infrared photodiode 100. The buffer layers 240 and 250 may be a hole injection layer (HIL), a hole transport layer (HTL), an electron blocking layer, an electron injection layer (EIL), an electron transport layer (ETL), a hole blocking layer, an optical auxiliary layer, or any combination thereof.

The infrared photodiode 100 is the same as described above.

Between the upper photodiode 200 and the infrared photodiode 100, an insulation layer 80 may be formed. The insulation layer 80 has a trench 85 exposing a charge storage 55, and the trench 85 may be filled with a filler.

The semiconductor substrate 40 may be the same as above, and the charge storage 55 is electrically connected to the first electrode 110 of the infrared photodiode 100 or the lower electrode 210 of the upper photodiode 200.

Between the infrared photodiode 100 and the semiconductor substrate 40, an insulation layer 60 is formed. The insulation layer 60 has a trench 65 exposing the charge storage 55, and the trench 65 may be filled with a filler.

Figure 8:
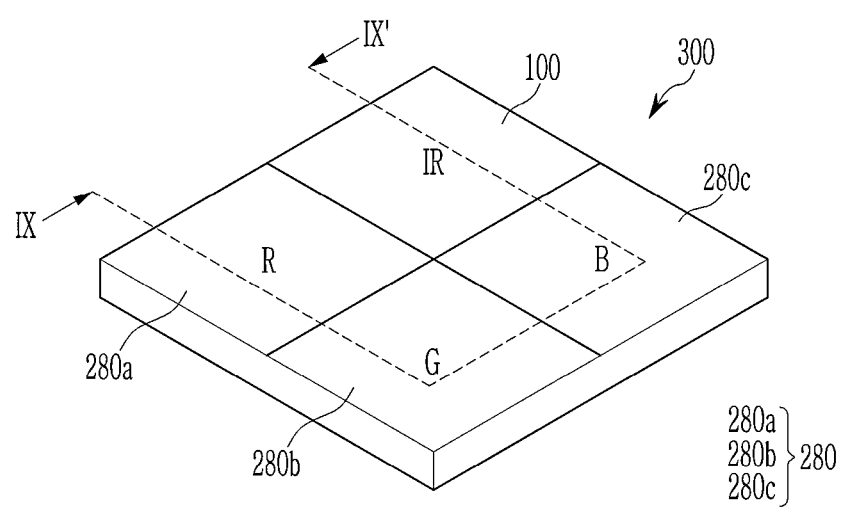
FIG. 8 is a perspective view schematically showing an example of a sensor according to some example embodiments.
Figure 9:
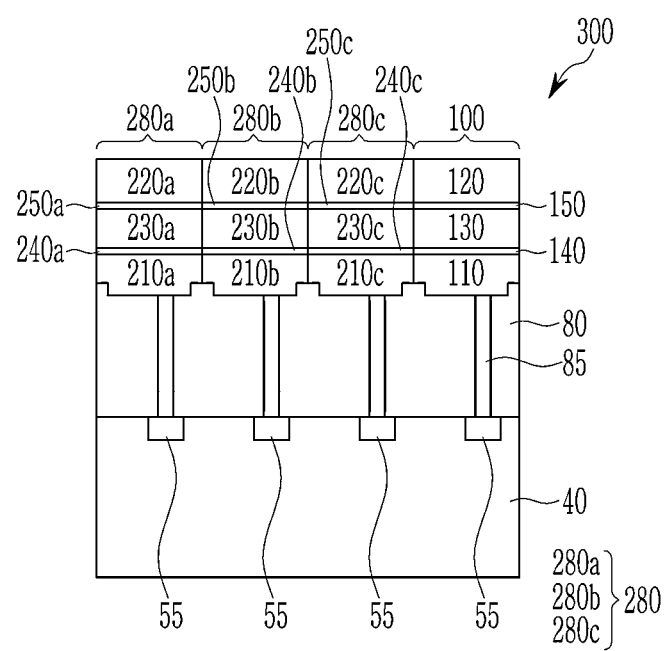
FIG. 9 is a cross-sectional view along cross-section view line IX-IX' of FIG. 8, schematically showing an example of the sensor of FIG. 8.

FIG. 8 is a perspective view schematically showing an example of a sensor according to some example embodiments, and FIG. 9 is a cross-sectional view along cross-section view line IX-IX' of FIG. 8, schematically showing an example of the sensor of FIG. 8.

Referring to FIGS. 8 and 9, the sensor 300 according to some example embodiments includes the semiconductor substrate 40, the infrared photodiode 100, and the visible photodiode 280. The visible photodiode 280 includes a red photodiode 280a detecting light in a red wavelength region, a green photodiode 280b detecting light in a green wavelength region, and a blue photodiode 280c detecting light in a blue wavelength region. In some example embodiments, the visible photodiode 280 in any of the example embodiments may be the same as the upper photodiode 200 in any of the example embodiments. In some example embodiments the upper photodiode 200 in any of the example embodiments may be the same as the visible photodiode 280 in any of the example embodiments.

The infrared photodiode 100, the red photodiode 280a, the green photodiode 280b, and the blue photodiode 280c are aligned in a parallel direction to the surface of the semiconductor substrate 40 and respectively electrically connected to charge storage 55 integrated in the semiconductor substrate 40. The infrared photodiode 100, the red photodiode 280a, the green photodiode 280b, and the blue photodiode 280c are each photoelectric conversion device.

The infrared photodiode 100 is the same as described above.

The red photodiode 280a includes a lower electrode 210a, a red photoelectric conversion layer 230a, an upper electrode 220a, and buffer layers 240a and 250a. The green photodiode 280b includes a lower electrode 210b, a green photoelectric conversion layer 230b, an upper electrode 220b, and buffer layers 240b and 250b. The blue photodiode 280c includes a lower electrode 210c, a blue photoelectric conversion layer 230c, an upper electrode 220c, and buffer layers 240c and 250c. The red photoelectric conversion layer 230a may be configured to selectively absorb light in a red wavelength region for photoelectric conversion, the green photoelectric conversion layer 230b may be configured to selectively absorb light in a green wavelength region for photoelectric conversion, and the blue photoelectric conversion layer 230c may be configured to selectively absorb light in a blue wavelength region to perform photoelectric conversion. The lower electrodes 210a, 210b, and 210c and the upper electrodes 220a, 220b, and 220c may be light-transmitting electrodes, respectively. The red photoelectric conversion layer 230a, the green photoelectric conversion layer 230b, and the blue photoelectric conversion layer 230c may each independently include an inorganic light absorbing material, an organic light absorbing material, an organic-inorganic light absorbing material, or any combination thereof. For example, at least one of the red photoelectric conversion layer 230a, the green photoelectric conversion layer 230b, or the blue photoelectric conversion layer 230c may include an organic photoelectric conversion material. At least one of the buffer layers 240a, 240b, 240c, 250a, 250b, or 250c may be omitted.

Figure 10:
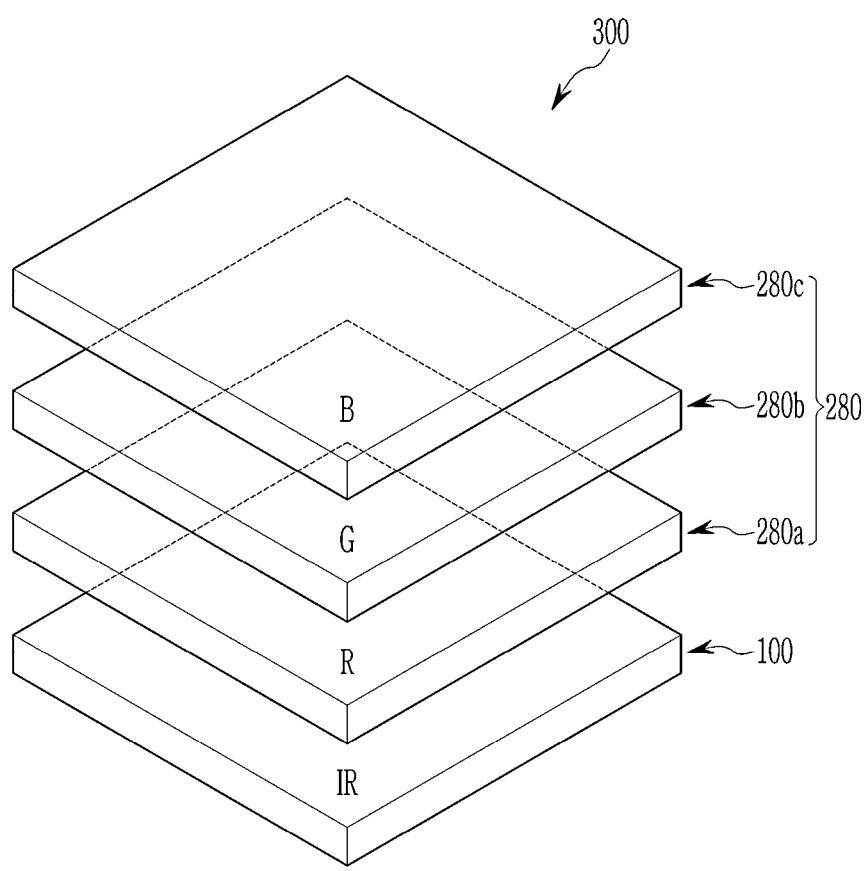
FIG. 10 is a perspective view schematically showing an example of a sensor according to some example embodiments.
Figure 11:
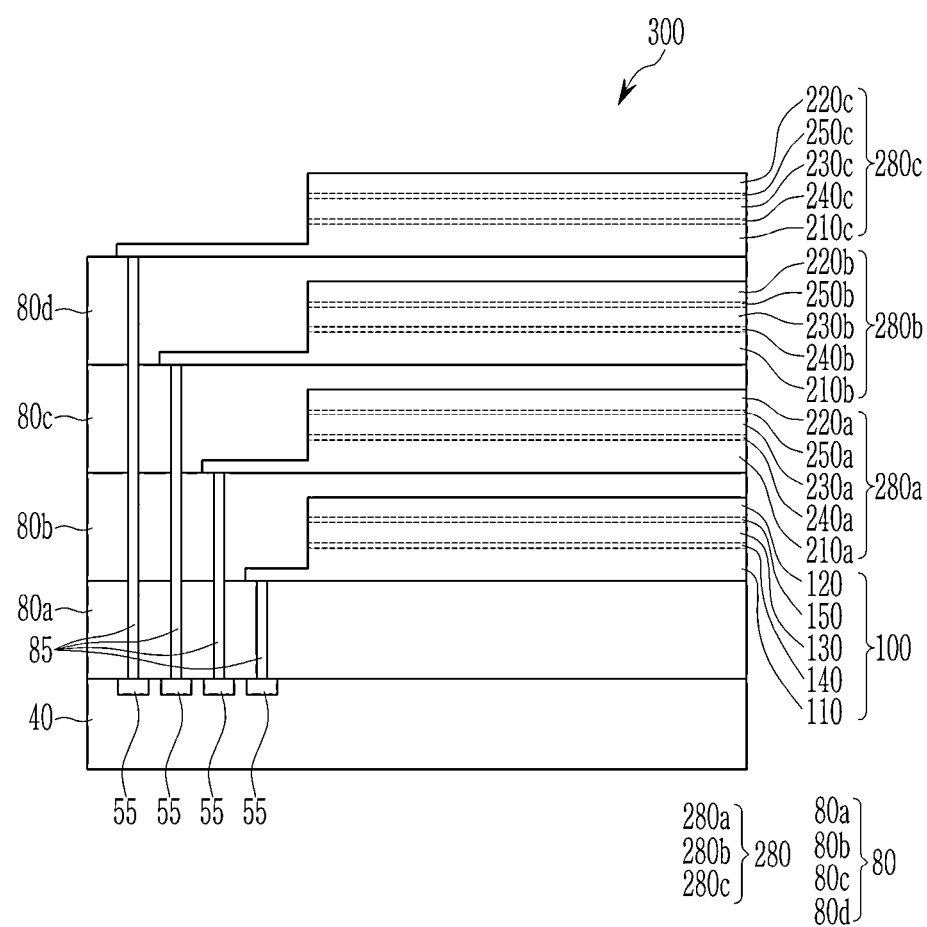
FIG. 11 is a cross-sectional view schematically showing an example of the sensor of FIG. 10.

FIG. 10 is a perspective view schematically showing an example of a sensor according to some example embodiments, and FIG. 11 is a cross-sectional view schematically showing an example of the sensor of FIG. 10.

Referring to FIGS. 10 and 11, the sensor 300 according to some example embodiments includes the semiconductor substrate 40, the infrared photodiode 100, the visible photodiode 280, and the insulation layer 80.

The visible photodiode 280 may be an image sensor absorbing at least a portion of light in a visible wavelength region and converting it into electrical signals, a red photodiode 280a detecting light in a red wavelength region, green photodiode 280b detecting light in a green wavelength region, and a blue photodiode 280c detecting light in a blue wavelength region.

The infrared photodiode 100 and the visible photodiode 280 may be stacked along a thickness direction of the semiconductor substrate 40. For example, the infrared photodiode 100 is disposed on top, while the visible photodiode 280 is disposed at the bottom, but the present inventive concepts are not limited thereto. In the drawing, the red photodiode 280a, the green photodiode 280b, and the blue photodiode 280c are sequentially stacked, but the red photodiode 280a, the green photodiode 280b, and the blue photodiode 280c may be stacked in various orders.

The infrared photodiode 100, the red photodiode 280a, the green photodiode 280b, and the blue photodiode 280c are the same as described above.

The infrared photodiode 100, the red photodiode 280a, the green photodiode 280b, and the blue photodiode 280c are each electrically connected to a charge storage 55 integrated in the semiconductor substrate 40. Between the semiconductor substrate 40 and the infrared photodiode 100 and between the infrared photodiode 100 and the visible photodiode 280, each insulation layer 80a, 80b, 80c, and 80d is disposed.

The aforementioned infrared photodiode 100 and/or sensor 300 may be applied to various electronic devices, for example, a mobile phone, a digital camera, a display device, a biometric device, a security device, an automobile electronic component, and/or like but is not limited thereto.

Figure 12:
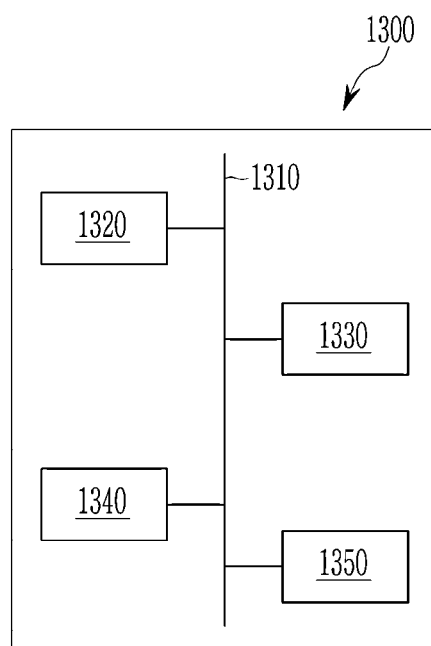
FIG. 12 is a schematic diagram of an electronic device according to some example embodiments.

FIG. 12 is a schematic diagram of an electronic device according to some example embodiments.

Referring to FIG. 12, the electronic device 1300 includes a processor 1320, a memory 1330, a sensor 1340, and a display unit 1350 (e.g., a light emitting diode (LED) display panel device, an organic LED (OLED) display panel device, or the like) which are electrically connected through a bus 1310. The sensor 1340 may be the aforementioned sensor 300. The processor 1320 may perform a memory program and thus at least one function. The processor 1320 may additionally perform a memory program and thus display an image on the display unit 1350. The processor 1320 may generate an output.

The memory 1330 may be a non-transitory computer readable medium and may store a program of instructions. The memory 1330 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1320 may execute the stored program of instructions to perform one or more functions. For example, the processor 1320 may be configured to process electrical signals generated by the sensor 1340. The processor 1320 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 1320 may be configured to generate an output (e.g., an image to be displayed on the display unit 1350) based on such processing.

Hereinafter, some example embodiments are illustrated in more detail with reference to examples. However, the scope of the inventive concepts is not limited to these examples.

Manufacture of Infrared Photodiode I

Example 1

ITO (10 nm), Ag (120 nm), and ITO (10 nm) are sequentially deposited on a glass substrate to form a first electrode (reflective electrode) having an ITO/Ag/ITO structure. Subsequently, triphenylamine derivative is deposited on the first electrode to form a 10 nm-thick lower buffer layer. On the lower buffer layer, a near-infrared absorbing material represented by Chemical Formula A (a p-type semiconductor) and a C60 counter material (an n-type semiconductor) in a volume ratio (thickness ratio) of 50:150 are co-deposited to form a 200 nm-thick photoelectric conversion layer. On the photoelectric conversion layer, C60 is deposited to form a 5 nm-thick upper buffer layer, and a 5 nm of ytterbium (Yb) and a 30 nm of silver (Ag) are sequentially deposited thereon to form a second electrode (semi-transmissive layer). Then, 50 nm of aluminum oxide ($Al_2O_3$) and 200 nm of silicon oxynitride (SiON) are sequentially formed on the second electrode to manufacture an infrared photodiode.

[Chemical Formula A]

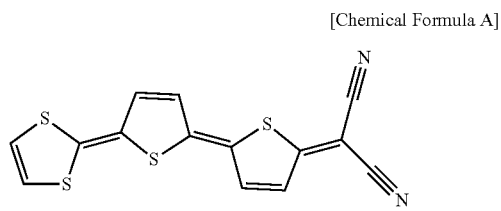 [SMILES: N#CC(C#N)=c1cc/c(=c2/ccc(=C3SC=CS3)s2)s1]

Example 2

An infrared photodiode is manufactured according to the same method as Example 1 except that a near-infrared absorbing material represented by Chemical Formula A (p-type semiconductor) and a C60 counter material (n-type semiconductor) in a volume ratio (thickness ratio) of 75:180 are co-deposited to form a 255 nm-thick photoelectric conversion layer.

Example 3

An infrared photodiode is manufactured according to the same method as Example 1 except that a near-infrared absorbing material represented by Chemical Formula A (p-type semiconductor) and a C60 counter material (n-type semiconductor) in a volume ratio (thickness ratio) of 80:180 are co-deposited to form a 260 nm-thick photoelectric conversion layer.

Comparative Example 1

An infrared photodiode is manufactured according to the same method as Example 2 except that ITO instead of the silver (Ag) is deposited to form a second electrode (light-transmitting electrode).

Evaluation I

The near-infrared absorbing material represented by Chemical Formula A are evaluated with respect to optical properties and thermal properties thereof.

The optical properties are evaluated from an absorption spectrum of the near-infrared absorbing material in a solution state (e.g., an absorption spectrum of the near-infrared absorbing material when the near-infrared absorbing material is in a solution state, which may be a state of being a liquid solution), and the thermal properties are evaluated from a thermogravimetric analysis (TGA) thereof.

(1) Optical Properties

The absorption spectrum of the near-infrared absorbing material in a solution state may be measured based on dissolving the near-infrared absorbing material represented by Chemical Formula A in a dimethylsulfoxide (DMSO) solvent at a concentration of about $1\times10^{-5}$ M to prepare a solution, irradiating UV light thereto with a UV-3600 spectrophotometer (Shimadzu Corp.) to measure absorbance of the solution.

Figure 13:
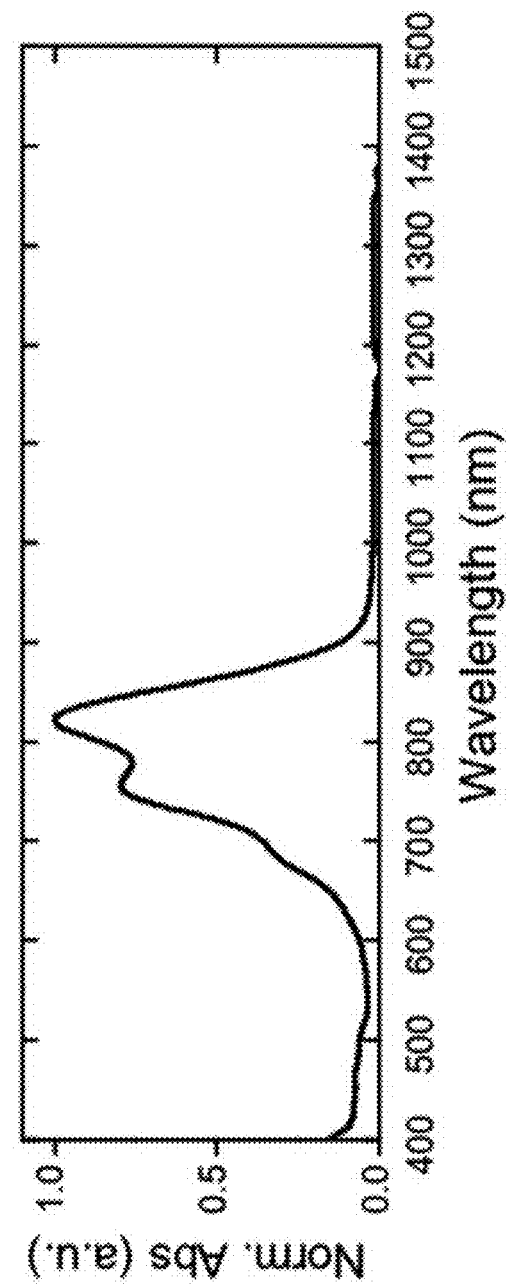
FIG. 13 is an absorption spectrum of a near-infrared absorbing material represented by Chemical Formula A.

The results are shown in Table 1 and FIG. 13.

FIG. 13 is the absorption spectrum of the near-infrared absorbing material represented by Chemical Formula A.

TABLE 1

|  | Maximum absorption wavelength (nm) | Full width at half maximum (FWHM) (nm) |
|---|---|---|
| Near-infrared absorbing material (Chemical Formula A) | 820 | 140 |

Referring to Table 1 and FIG. 13, the absorption spectrum of the near-infrared absorbing material represented by Chemical Formula A in a solution state turns out to have a maximum absorption wavelength in a wavelength region of greater than about 700 nm and less than or equal to about 950 nm.

(2) Thermal Properties

A sublimation temperature of the near-infrared absorbing material represented by Chemical Formula A is evaluated.

The sublimation temperature is evaluated through a thermogravimetric analysis (TGA) by increasing a temperature under a vacuum degree (e.g., ambient pressure) of 10 Pa or less (e.g., between 0 Pa and about 10 Pa) to obtain a temperature $T_{s(10)}$ where a weight of the sample decreased by 10% compared with the initial weight, a temperature $T_{s(30)}$ where the weight of the sample decreased by 30% compared with the initial weight, and a temperature $T_{s(50)}$ where the weight of the sample decreased by 50% compared with the initial weight.

The results are shown in Table 2.

TABLE 2

|  | Sublimation temperature (° C.) | | |
| --- | --- | --- | --- |
|  | $T_{s(10)}$ | $T_{s(30)}$ | $T_{s(50)}$ |
| Near-infrared absorbing material (Chemical Formula A) | 252 | 265 | 281 |

* $T_{s(10)}$ (° C.): a temperature at which the weight of the sample decreased by 10% compared to the initial weight
* $T_{s(30)}$ (° C.): a temperature at which the weight of the sample decreased by 30% compared to the initial weight
* $T_{s(50)}$ (° C.): a temperature at which the weight of the sample decreased by 50% compared to the initial weight Referring to Table 2, the near-infrared absorbing material represented by Chemical Formula A has a temperature at which a weight loss of 10%, 30%, and 50% relative to the initial weight all at less than or equal to about 500° C. (less than or equal to about 300° C.), near-infrared absorbing material represented by Chemical Formula A and accordingly, turns out to be a vapor deposition compound that sublimes well at a relatively low temperature.

Evaluation II

An absorption spectrum of the photoelectric conversion layer of the infrared photodiode according to Example 1 is evaluated.

Figure 14:
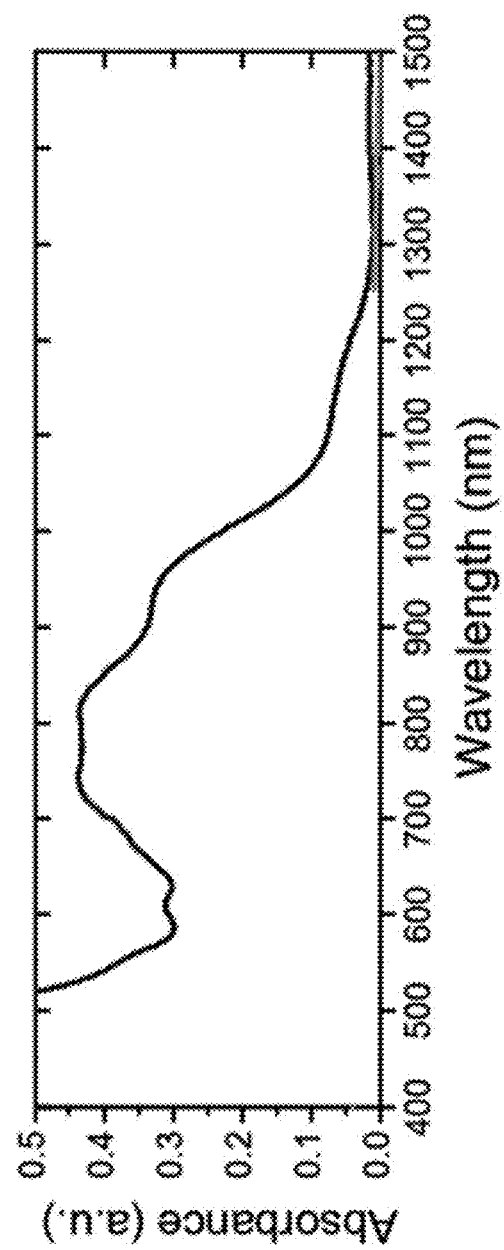
FIG. 14 is an absorption spectrum of a photoelectric conversion layer of an infrared photodiode according to Example 1.

FIG. 14 shows the absorption spectrum of the photoelectric conversion layer of the infrared photodiode according to Example 1.

Referring to FIG. 14, the absorption spectrum of the photoelectric conversion layer, like the absorption spectrum of the near-infrared absorbing material represented by Chemical Formula A alone, has a peak wavelength in a near-infrared wavelength region of greater than about 700 nm and less than or equal to about 950 nm and also, a wider full width at half maximum (FWHM) than the absorption spectrum of the near-infrared absorbing material represented by Chemical Formula A alone.

Evaluation III

The infrared photodiodes according to Examples and Comparative Examples are evaluated with respect to electrical characteristics thereof.

The electrical characteristics are evaluated by using photoelectric conversion efficiency, detection selectivity, and a dark current.

The photoelectric conversion efficiency is evaluated from an EQE maximum value ($EQE_{max}$) from an EQE spectrum in a wavelength region of 800 nm to 1500 nm at 3 V in an IPCE (Incident Photon to Current Efficiency) method.

The detection selectivity of the infrared photodiodes is evaluated from a full width at half maximum (FWHM) of the EQE spectrum.

The dark current is evaluated from a dark current density by measuring each current of the devices with a current-voltage evaluation equipment (K4200 parameter analyzer, Keithley) under a dark room condition and dividing it by a unit pixel area (0.04 cm$^2$), and herein, the dark current density is evaluated from a current flowing when a reverse bias of −3 V is applied thereto.

Figure 15:
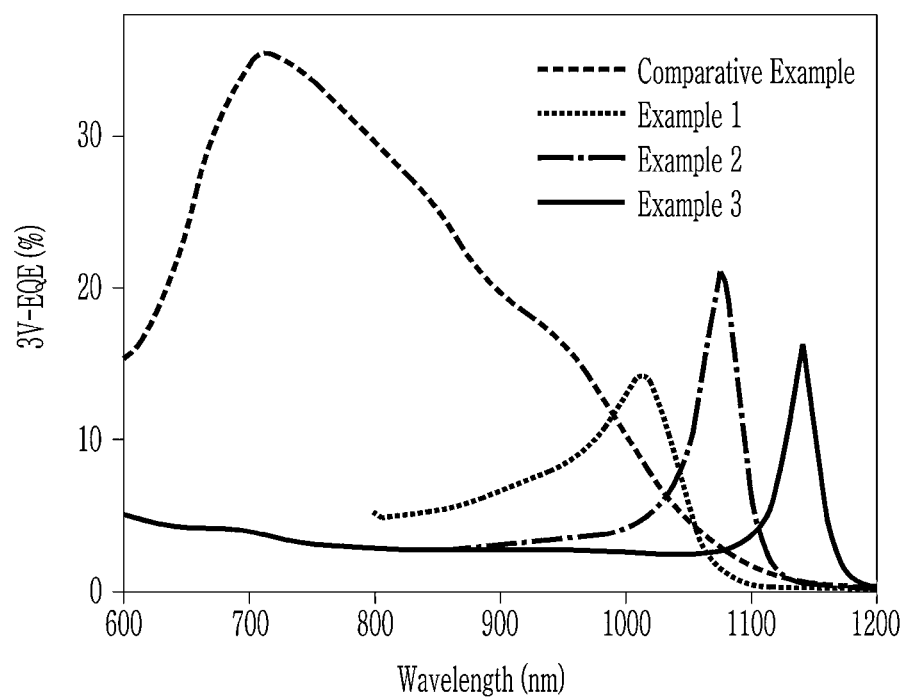
FIG. 15 is an external quantum efficiency (EQE) spectrum of the infrared photodiode according to Examples 1 to 3 and Comparative Example 1.

The results are shown in Table 3 and FIG. 15.

FIG. 15 shows the EQE spectra of the infrared photodiodes according to Examples 1 to 3 and Comparative Example 1.

TABLE 3

|  | $\lambda_{peak,EQE}$ (nm) | $EQE_{max}$ (−3 V) (%) | Full width at half maximum (FWHM) (nm) | Dark current (h/s/μm$^2$) |
| --- | --- | --- | --- | --- |
| Example 1 | 1015 | 14 | 139 | 2.8 × 10$^4$ |
| Example 2 | 1075 | 21 | 41 | 1.6 × 10$^4$ |
| Example 3 | 1140 | 16 | 34 | 6.2 × 10$^4$ |
| Comparative Example 1 | 715 | 35 | 313 | 2.4 × 10$^4$ |

* $\lambda_{peak,EQE}$: peak wavelength of EQE spectrum
* $EQE_{max}$: EQE at the peak wavelength of EQE spectrum Referring to Table 3 and FIG. 15, the infrared photodiodes according to Examples and Comparative Examples commonly include a photoelectric conversion layer having a maximum absorption wavelength in a near-infrared wavelength region of greater than about 700 nm and less than or equal to about 950 nm (refer to Evaluation II), but the EQE spectra of the infrared photodiodes of Examples adopting a microcavity structure have a peak wavelength in a wavelength region of greater than about 1000 nm, while the EQE spectra of the infrared photodiodes of Comparative Examples adopting no microcavity structure have a peak wavelength in a similar wavelength region (greater than about 700 nm and less than or equal to 950 nm) to that of the photoelectric conversion layer. Accordingly, the EQE spectra of the infrared photodiodes according to Examples adopting a microcavity structure exhibit a wavelength region shift toward a longer wavelength than the absorption spectrum of the photoelectric conversion layer.

In addition, when peak wavelengths ($\lambda_{peak,\ EQE}$) of the EQE spectra of the infrared photodiodes of Examples 1, 2, and 3 are compared, the thicker the photoelectric conversion layers of the infrared photodiodes, the more shift toward a longer wavelength the peak wavelengths ($\lambda_{peak,\ EQE}$) of the EQE spectra exhibit.

In addition, referring to Table 3, the infrared photodiodes of Examples 1 to 3 are designed to have a microcavity structure exhibiting optimal EQE and dark current characteristics.

Manufacture of Infrared Photodiode II

Example 4

ITO (10 nm), Ag (120 nm), and ITO (50 nm) are sequentially deposited on a glass substrate to form a first electrode (reflective electrode) having an ITO/Ag/ITO structure. Subsequently, a triphenylamine derivative is deposited on the first electrode to form a 10 nm-thick lower buffer layer. On the lower buffer layer, a near-infrared absorbing material represented by Chemical Formula A (p-type semiconductor) and a C60 counter material (n-type semiconductor) in a volume ratio (thickness ratio) of 50:150 are co-deposited to form a 200 nm-thick photoelectric conversion layer. On the photoelectric conversion layer, C60 is deposited to form a 5 nm-thick upper buffer layer, and 5 nm of ytterbium (Yb) and 30 nm of silver (Ag) are sequentially deposited on the upper buffer layer to form a second electrode (semi-transmissive layer). Then, 50 nm of aluminum oxide ($Al_2O_3$) and 200 nm of silicon oxynitride (SiON) are sequentially formed on the second electrode to manufacture an infrared photodiode.

Example 5

An infrared photodiode is manufactured according to the same method as Example 4 except that the near-infrared absorbing material (p-type semiconductor) and the C60 counter material (n-type semiconductor) are co-deposited in a volume ratio (thickness ratio) of 60:150.

Example 6

An infrared photodiode is manufactured according to the same method as Example 4 except that the near-infrared absorbing material (p-type semiconductor) and the C60 counter material (n-type semiconductor) are co-deposited in a volume ratio (thickness ratio) of 70:150.

Evaluation IV

The infrared photodiodes according to Example 4 to 6 are evaluated with respect to electrical characteristics.

Figure 16:
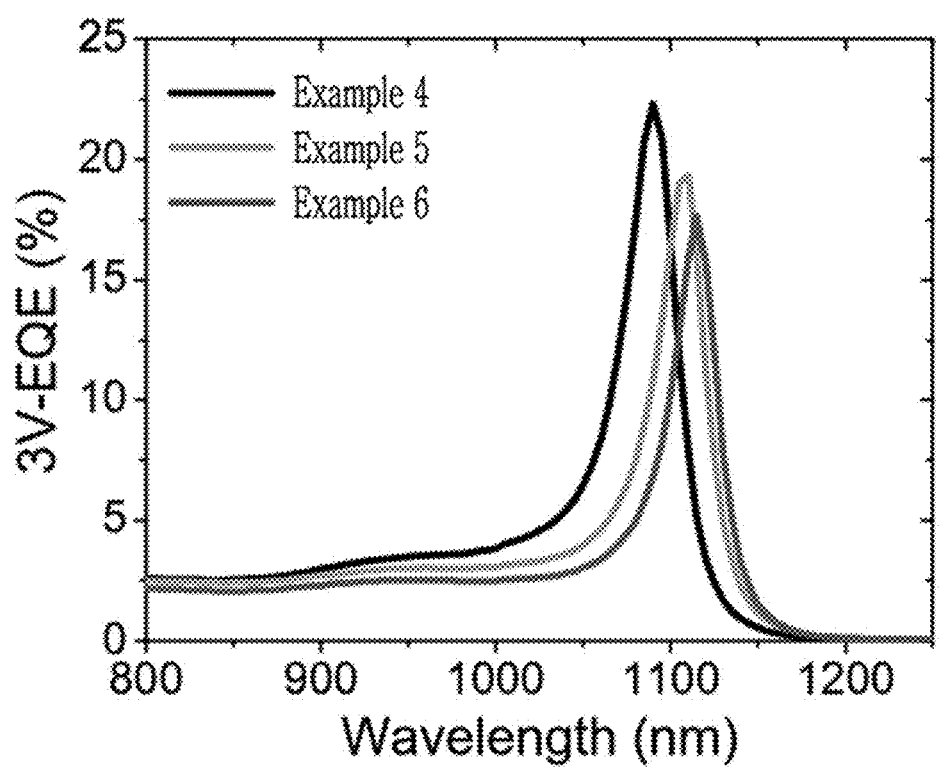
FIG. 16 shows external quantum efficiency (EQE) spectra of the infrared photodiodes according to Examples 4 to 6.

The results are shown in Table 4 and FIG. 16.

FIG. 16 shows EQE spectra of infrared photodiodes according to Examples 4 to 6.

TABLE 4

|  | $\lambda_{peak,EQE}$ (nm) | $EQE_{max}$ (−3 V) (%) | FWHM (nm) | Dark current (h/s/μm²) |
|---|---|---|---|---|
| Example 4 | 1090 | 22 | 38 | $2.5 \times 10^4$ |
| Example 5 | 1110 | 19 | 34 | $2.8 \times 10^4$ |
| Example 6 | 1115 | 18 | 32 | $2.3 \times 10^4$ |

* FWHM: Full width at half maximum

Referring to Table 4 and FIG. 16, EQE spectra of the infrared photodiodes adopting a microcavity structure according to Examples 4 to 6 have a peak wavelength in a wavelength region of greater than about 1000 nm, and as a composition ratio of the p-type semiconductor relative to the n-type semiconductor in the photoelectric conversion layers is higher, the peak wavelengths ($\lambda_{peak, EQE}$) of the EQE spectra shift more toward a longer wavelength.

In addition, since Examples 1 and 4 include the same photoelectric conversion layer but adopt a first electrode including a thicker light-transmitting auxiliary layer and thus have a longer distance (optical length) between a reflective layer and a semi-transmissive layer, the peak wavelengths ($\lambda_{peak,EQE}$) of the EQE spectra shift more toward a longer wavelength.

Manufacture of Infrared Photodiode III

Example 7

ITO (10 nm), Ag (120 nm), and ITO (10 nm) are sequentially deposited on a glass substrate to form a first electrode (reflective electrode) having an ITO/Ag/ITO structure. Subsequently, a triphenylamine derivative is deposited on the first electrode to form a 15 nm-thick lower buffer layer. On the lower buffer layer, the near-infrared absorbing material represented by Chemical Formula A (p-type semiconductor) and the C60 counter material (n-type semiconductor) in a volume ratio (thickness ratio) of 70:180 are co-deposited to form a 250 nm-thick photoelectric conversion layer. On the photoelectric conversion layer, C60 is deposited to form a 5 nm-thick upper buffer layer, and silver (Ag) is deposited thereon to form a 30 nm-thick second electrode (semi-transmissive layer). Then, 50 nm of aluminum oxide ($Al_2O_3$) and 200 nm of silicon oxynitride (SiON) are sequentially formed on the second electrode to manufacture an infrared photodiode.

Example 8

An infrared photodiode is manufactured according to the same method as Example 7 except that a 15 nm-thick upper buffer layer is formed instead of the 5 nm-thick upper buffer layer.

Example 9

An infrared photodiode is manufactured according to the same method as Example 7 except that a 25 nm-thick upper buffer layer is formed instead of the 5 nm-thick upper buffer layer.

Example 10

An infrared photodiode is manufactured according to the same method as Example 7 except that a 35 nm-thick upper buffer layer is formed instead of the 5 nm-thick upper buffer layer.

Evaluation V

The infrared photodiodes according to Example 7 to 10 are evaluated with respect to electrical characteristics.

Figure 17:
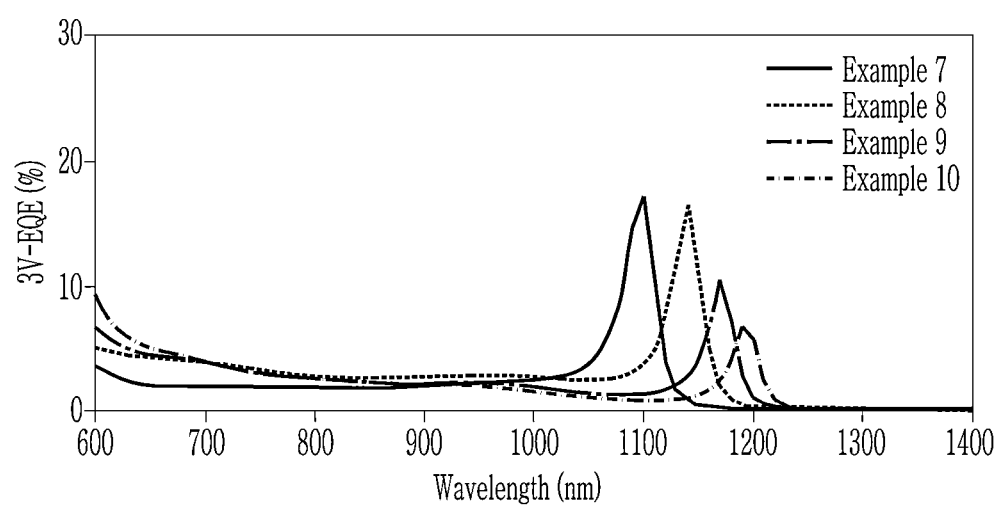
FIG. 17 shows external quantum efficiency (EQE) spectra of the infrared photodiodes according to Examples 7 to 10.

The results are shown in Table 5 and FIG. 17.

FIG. 17 shows EQE spectra of the infrared photodiodes according to Examples 7 to 10.

TABLE 5

|  | $\lambda_{peak,EQE}$ (nm) | $EQE_{max}$ (−3 V) (%) | Full width at half maximum (FWHM) (nm) | Dark current (h/s/μm²) |
|---|---|---|---|---|
| Example 7 | 1100 | 17.2 | 33 | $1.2 \times 10^4$ |
| Example 8 | 1140 | 16.4 | 31 | $5.1 \times 10^4$ |
| Example 9 | 1170 | 10.5 | 35 | $4.6 \times 10^4$ |
| Example 10 | 1190 | 6.6 | 28 | $3.7 \times 10^4$ |

Referring to Table 5 and FIG. 17, the EQE spectra of the infrared photodiodes adopting a microcavity structure according to Examples 7 to 10 have a peak wavelength in a wavelength region of greater than about 1000 nm, and the thicker the upper buffer layers thereof are, the more the peak wavelengths ($\lambda_{peak, EQE}$) of the EQE spectra shift toward a longer wavelength.

While the inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

What is claimed is:
1. An infrared photodiode, comprising:
    a first electrode, the first electrode including a reflective layer;
    a second electrode, the second electrode facing the first electrode; and a photoelectric conversion layer between the first electrode and the second electrode, the photoelectric conversion layer including an infrared absorbing material,
wherein a maximum absorption wavelength of the infrared absorbing material in a solution state is greater than about 700 nm and less than or equal to about 950 nm, and
wherein the infrared photodiode is configured to exhibit an external quantum efficiency (EQE) spectrum in a wavelength region of greater than or equal to about 1000 nm.

2. The infrared photodiode of claim 1, wherein
a peak wavelength of the EQE spectrum of the infrared photodiode is in a range of about 1000 nm to about 3000 nm, and
a full width at half maximum of the EQE spectrum of the infrared photodiode is in a range of about 5 nm to about 200 nm.

3. The infrared photodiode of claim 1, wherein
the photoelectric conversion layer comprises
the infrared absorbing material, and
a counter material forming a pn junction with the infrared absorbing material,
the wavelength region of the EQE spectrum of the infrared photodiode is overlapped with a portion of a wavelength region of an absorption spectrum of the photoelectric conversion layer, and
a peak wavelength of the EQE spectrum of the infrared photodiode is longer than a peak wavelength of the absorption spectrum of the photoelectric conversion layer.

4. The infrared photodiode of claim 3, wherein a difference between the peak wavelength of the EQE spectrum of the infrared photodiode and the peak wavelength of the absorption spectrum of the photoelectric conversion layer is greater than or equal to about 100 nm.

5. The infrared photodiode of claim 3, wherein
the peak wavelength of the EQE spectrum of the infrared photodiode is in a range of about 1000 nm to about 3000 nm, and
the peak wavelength of the absorption spectrum of the photoelectric conversion layer is in a range of about 700 nm to about 1000 nm.

6. The infrared photodiode of claim 1, wherein
the photoelectric conversion layer comprises
the infrared absorbing material, and
a counter material forming a pn junction with the infrared absorbing material,
a peak wavelength of the EQE spectrum of the infrared photodiode is at least partially defined by a composition ratio of the infrared absorbing material to the counter material, and
the peak wavelength of the EQE spectrum of the infrared photodiode is proportional to the composition ratio of the infrared absorbing material to the counter material, such that, as the composition ratio of the infrared absorbing material to the counter material increases, the peak wavelength of the EQE spectrum of the infrared photodiode shifts to a longer wavelength.

7. The infrared photodiode of claim 6, wherein the composition ratio of the infrared absorbing material to the counter material is about 0.10 to about 1.00.

8. The infrared photodiode of claim 1, wherein
a peak wavelength of the EQE spectrum of the infrared photodiode is at least partially defined by a thickness of the photoelectric conversion layer, and
the peak wavelength of the EQE spectrum of the infrared photodiode is proportional to the thickness of the photoelectric conversion layer, such that, as the thickness of the photoelectric conversion layer increases, the peak wavelength of the EQE spectrum of the infrared photodiode shifts to a longer wavelength.

9. The infrared photodiode of claim 8, wherein the thickness of the photoelectric conversion layer is about 100 nm to about 500 nm.

10. The infrared photodiode of claim 1, wherein
the second electrode comprises a semi-transmissive layer forming a microcavity with the reflective layer of the first electrode, and
a peak wavelength of the EQE spectrum of the infrared photodiode corresponds to a resonance wavelength of the microcavity.

11. The infrared photodiode of claim 10, wherein
the second electrode comprises a light-transmitting auxiliary layer between the semi-transmissive layer and the photoelectric conversion layer, and
the peak wavelength of the EQE spectrum of the infrared photodiode is at least partially defined by a thickness of the light-transmitting auxiliary layer of the second electrode, and
the peak wavelength of the EQE spectrum of the infrared photodiode is proportional to the thickness of the light-transmitting auxiliary layer of the second electrode, such that, as the thickness of the light-transmitting auxiliary layer of the second electrode increases, the peak wavelength of the EQE spectrum of the infrared photodiode shifts to a longer wavelength.

12. The infrared photodiode of claim 11, wherein the thickness of the light-transmitting auxiliary layer of the second electrode is about 5 nm to about 50 nm.

13. The infrared photodiode of claim 1, wherein
the second electrode is a light-transmitting electrode,
the infrared photodiode further includes an optical auxiliary layer on the second electrode, the optical auxiliary layer forming a microcavity with the reflective layer of the first electrode, and
a peak wavelength of the EQE spectrum of the infrared photodiode corresponds to a resonance wavelength of the microcavity.

14. The infrared photodiode of claim 1, wherein
the second electrode comprises an inorganic nanolayer facing the photoelectric conversion layer, and
the inorganic nanolayer comprises ytterbium (Yb), calcium (Ca), potassium (K), barium (Ba), magnesium (Mg), lithium fluoride (LiF), or an alloy thereof.

15. The infrared photodiode of claim 1, wherein
the first electrode comprises a light-transmitting auxiliary layer between the reflective layer and the photoelectric conversion layer,
a peak wavelength of the EQE spectrum of the infrared photodiode is at least partially defined by a thickness of the light-transmitting auxiliary layer of the first electrode, and
the peak wavelength of the EQE spectrum of the infrared photodiode is proportional to the thickness of the light-transmitting auxiliary layer of the first electrode, such that, as the thickness of the light-transmitting auxiliary layer of the first electrode increases, the peak wavelength of the EQE spectrum of the infrared photodiode shifts to a longer wavelength.

16. The infrared photodiode of claim 15, wherein
the thickness of the light-transmitting auxiliary layer of the first electrode is about 5 nm to about 50 nm.

17. The infrared photodiode of claim 1, further comprising:
a buffer layer that is at least one of
between the first electrode and the photoelectric conversion layer, or
between the second electrode and the photoelectric conversion layer,
wherein a peak wavelength of the EQE spectrum of the infrared photodiode is at least partially defined by a thickness of the buffer layer, and
wherein the peak wavelength of the EQE spectrum of the infrared photodiode is proportional to the thickness of the buffer layer, such that, as the thickness of the buffer layer increases, the peak wavelength of the EQE spectrum of the infrared photodiode shifts to a longer wavelength.

18. The infrared photodiode of claim 17, wherein the thickness of the buffer layer is about 5 nm to about 200 nm.

19. The infrared photodiode of claim 1, wherein
the infrared photodiode is configured to exhibit a peak wavelength of an EQE spectrum belonging to about 1000 nm to about 1300 nm, and
the infrared photodiode is configured to exhibit a maximum external quantum efficiency at the peak wavelength of the EQE spectrum, where the maximum external quantum efficiency is greater than or equal to about 5%.

20. The infrared photodiode of claim 1, wherein the infrared absorbing material is a compound that is configured to have a temperature of less than or equal to about 500° C. at which a weight loss of 50% compared to an initial weight of the compound occurs during thermogravimetric analysis of the compound at an ambient pressure of less than or equal to about 10 Pa.

21. The infrared photodiode of claim 1, wherein the infrared absorbing material is a coplanar compound including at least one quinoid moiety.

22. The infrared photodiode of claim 1, wherein the infrared absorbing material is represented by Chemical Formula 1:

[Chemical Formula 1]

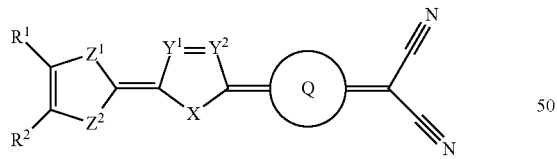

wherein, in Chemical Formula 1,
X is O, S, Se, Te, SO, SO$_2$, NR$^a$, CR$^b$R$^c$, or SiR$^d$R$^e$,
Y$^1$ and Y$^2$ are each independently CR$^f$ or N,
Z$^1$ and Z$^2$ are each independently O, S, Se, Te, or NR$^g$,
Q is at least one substituted or unsubstituted 5-membered quinoid ring, at least one substituted or unsubstituted 6-membered quinoid ring, or a fused ring thereof,
R$^1$ and R$^2$ are each independently hydrogen, a substituted or unsubstituted C1 to C30 alkyl group, a substituted or unsubstituted C1 to C30 alkoxy group, a substituted or unsubstituted C1 to C30 thioalkoxy group, a substituted or unsubstituted C6 to C30 aryl group, a substituted or unsubstituted C3 to C30 heterocyclic group, a substituted or unsubstituted silyl group, a halogen, or any combination thereof,
R$^a$ to R$^g$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, a cyano group, or any combination thereof,
R$^1$ and R$^2$ are each independently present or combine with each other to form a ring,
R$^b$ and R$^c$ are each independently present or combine with each other to form a ring,
R$^d$ and R$^e$ are each independently present or combine with each other to form a ring, and
adjacent R$^f$'s are each independently present or combine with each other to form a ring.

23. The infrared photodiode of claim 22, wherein the infrared absorbing material is represented by Chemical Formula 1-1:

[Chemical Formula 1-1]

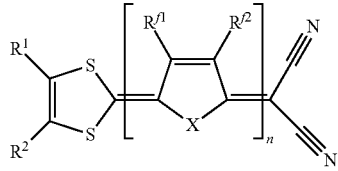

wherein, in Chemical Formula 1-1,
X is O, S, Se, Te, SO, SO$_2$, NR$^a$, CR$^b$R$^c$, or SiR$^d$R$^e$,
R$^1$ and R$^2$ are each independently hydrogen, a substituted or unsubstituted C1 to C30 alkyl group, a substituted or unsubstituted C1 to C30 alkoxy group, a substituted or unsubstituted C1 to C30 thioalkoxy group, a substituted or unsubstituted C6 to C30 aryl group, a substituted or unsubstituted C3 to C30 heterocyclic group, a substituted or unsubstituted silyl group, a halogen, or any combination thereof,
R$^a$ to R$^e$, R$^{f1}$ and R$^{f2}$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, a cyano group, or any combination thereof, and
n is an integer of 2 to 4.

24. A sensor, comprising:
a semiconductor substrate; and
the infrared photodiode of claim 1 on the semiconductor substrate.

25. An electronic device comprising the infrared photodiode of claim 1.

26. An infrared photodiode, comprising:
a first electrode, the first electrode including a reflective layer;
a second electrode, the second electrode facing the first electrode; and
a photoelectric conversion layer between the first electrode and the second electrode, the photoelectric conversion layer configured to photoelectrically convert at least a portion of incident light,
wherein at least a portion of the infrared photodiode forms a microcavity with the reflective layer of the first electrode, the photoelectric conversion layer being between the first electrode and the portion of the infrared photodiode, wherein the infrared photodiode is configured to exhibit an external quantum efficiency (EQE) spectrum having a wavelength region that includes a peak wavelength of the EQE spectrum of the infrared photodiode that corresponds to a resonance wavelength of the microcavity, wherein the wavelength region of the EQE spectrum of the infrared photodiode is different from a wavelength region of an absorption spectrum of the photoelectric conversion layer.

27. The infrared photodiode of claim 26, wherein the peak wavelength of the EQE spectrum of the infrared photodiode is longer than a peak wavelength of the absorption spectrum of the photoelectric conversion layer.

28. The infrared photodiode of claim 26, wherein the second electrode comprises a semi-transmissive layer forming the microcavity with the reflective layer of the first electrode.

29. The infrared photodiode of claim 26, wherein
the second electrode is a light-transmitting electrode, and
the infrared photodiode further includes an optical auxiliary layer on the second electrode, the optical auxiliary layer forming the microcavity with the reflective layer of the first electrode.

30. A sensor, comprising:
a semiconductor substrate; and
the infrared photodiode of claim 26 on the semiconductor substrate.

31. An electronic device comprising the infrared photodiode of claim 26.

* * * * *